United States Patent [19]

Yoshinaga et al.

[11] Patent Number: 5,434,717
[45] Date of Patent: Jul. 18, 1995

[54] READ AND/OR WRITE INTEGRATED CIRCUIT HAVING AN OPERATION TIMING ADJUSTING CIRCUIT AND CONSTANT CURRENT ELEMENTS

[75] Inventors: Masaki Yoshinaga, Tachikawa; Yuji Nagaya; Tsuyoshi Hirose, both of Ome; Noriaki Hatanaka, Chigasaki; Tomoaki Hirai, Odawara; Tatsuo Mochizuki, Yokohama, all of Japan

[73] Assignee: Hitachi, Ltd., Tokyo, Japan

[21] Appl. No.: 214,846

[22] Filed: Mar. 18, 1994

[30] Foreign Application Priority Data

Mar. 19, 1993 [JP] Japan .................. 5-085430

[51] Int. Cl.6 ..................... G11B 5/9; G11B 15/14
[52] U.S. Cl. .................................. 360/46; 360/68
[58] Field of Search ............... 360/46, 45, 66, 68, 360/29; 365/87, 190, 208; 375/4; 395/400; 348/653; 330/256, 261, 255

[56] References Cited

U.S. PATENT DOCUMENTS

| | | | |
|---|---|---|---|
| 3,828,362 | 8/1974 | Au | 360/45 |
| 3,883,858 | 5/1975 | Lienhard et al. | 365/87 |
| 4,191,977 | 3/1980 | Lewkowicz | 360/66 |
| 4,249,219 | 2/1981 | Aoi et al. | 360/46 |
| 4,415,995 | 11/1983 | Glock | 365/190 |
| 4,573,116 | 2/1986 | Ong et al. | 395/400 |
| 5,088,106 | 2/1992 | Kitamura et al. | 375/4 |
| 5,287,314 | 2/1994 | Flannagan et al. | 365/208 |

FOREIGN PATENT DOCUMENTS

| | | |
|---|---|---|
| 57-172516 | 10/1982 | Japan . |
| 60-136910 | 7/1985 | Japan . |
| 60-201505 | 10/1985 | Japan . |
| 61-42706 | 3/1986 | Japan . |
| 61-170909 | 8/1986 | Japan . |
| 63-257903 | 10/1988 | Japan . |
| 3-104006 | 5/1991 | Japan . |

OTHER PUBLICATIONS

K. B. Klaassen, "Magnetic Recording Channel Front-ends", IEEE Transactions On Magnetics, vol. 27, No. 6, Nov. 1991, pp. 4503–4508.

David P. Swart et al, ISSCC 93/Session 13, Hard Disk and Tape Drives, Paper FA 13.4, IEEE International Solid-State Circuits Conference, 1993, pp. 218–219, 291.

*Primary Examiner*—Aristotelis Psitos
*Assistant Examiner*—Patrick Wamsley
*Attorney, Agent, or Firm*—Fay, Sharpe, Beall, Fagan, Minnich & McKee

[57] ABSTRACT

A timing adjusting circuit is provided to define the operating order of a differential amplifier circuit for amplifying read-out signals and an output circuit in order to minimize changes in output DC level. A damping resistor is disposed between two magnetic head terminals and a clamp circuit in a magnetic head driving circuit. To attend to a composite head configuration, short-circuiting with a power supply and a current flowing into the magnetic head during a non-write operation are detected as abnormalities. In addition, short-circuiting and open-circuiting of the magnetic head are also detected as abnormalities. Also, a read circuit is added to a write magnetic head, in order to output read-out signals in a read mode, so that the read-out signals are utilized for detecting errors in read-out signals from an exclusively designed read head or for detecting and correcting such errors.

4 Claims, 12 Drawing Sheets

FIG. 5
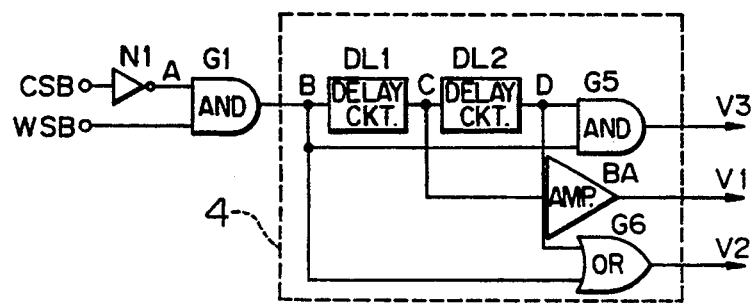
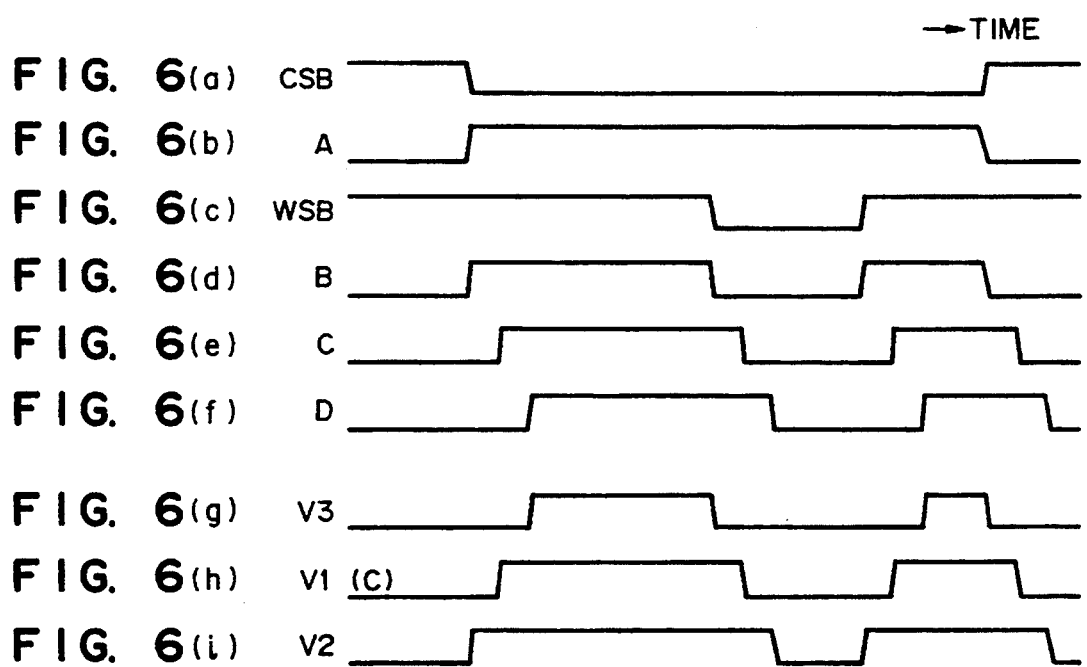

FIG. 8(a) NORMAL OPERATIONAL 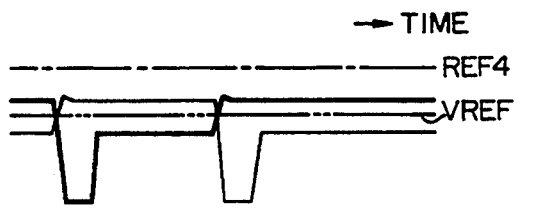
FIG. 8(b) SHORT-CIRCUITING OF HEAD 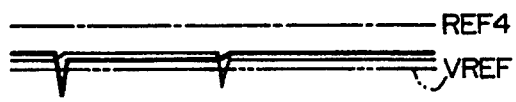
FIG. 8(c) SHORT-CIRCUITING WITH POWER SUPPLY 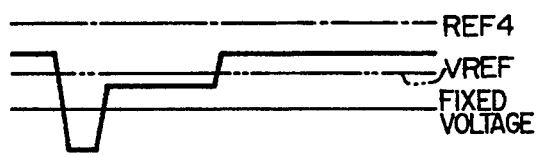
FIG. 8(d) OPENED HEAD 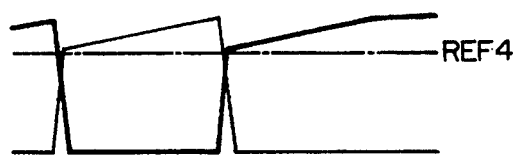

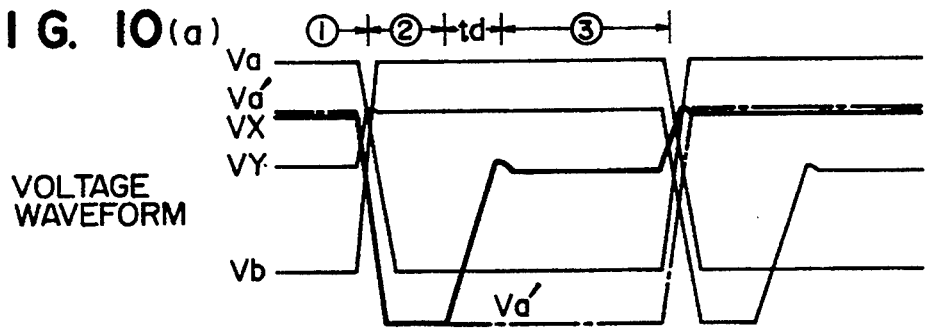
FIG. 10(a) VOLTAGE WAVEFORM
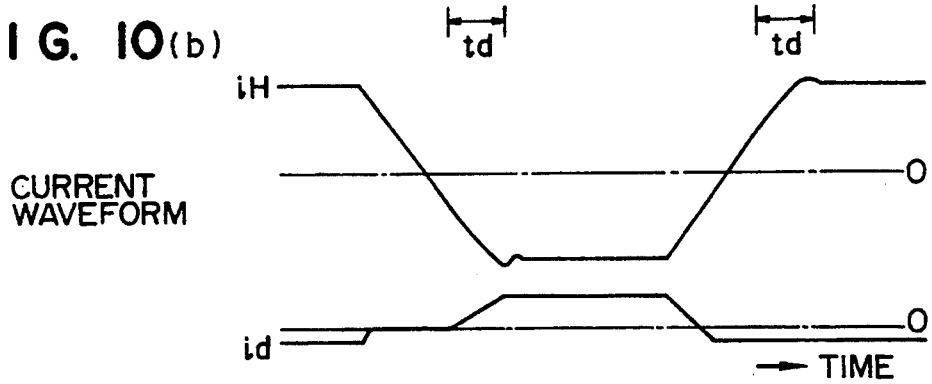
FIG. 10(b) CURRENT WAVEFORM
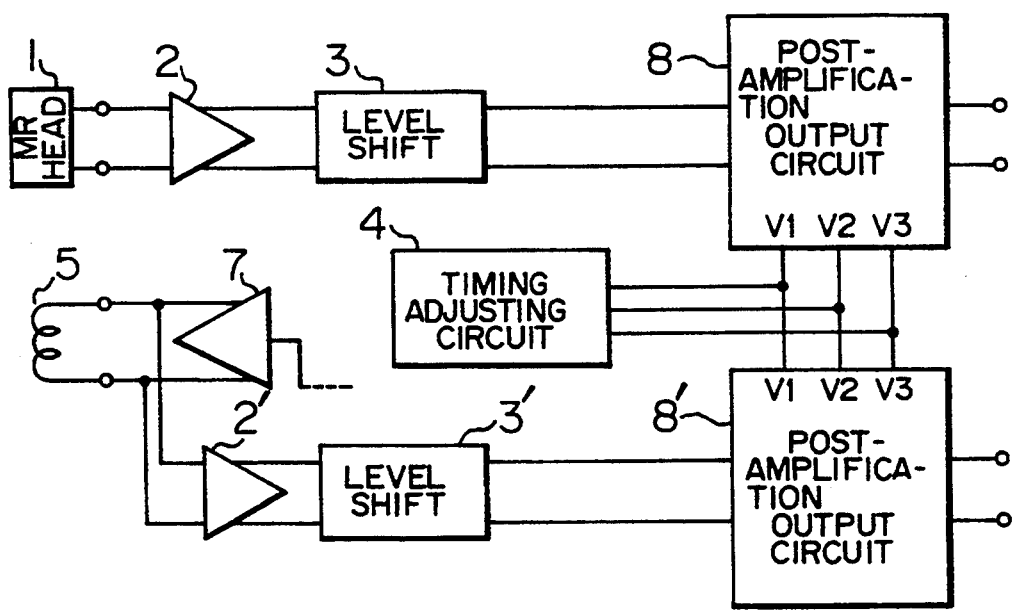
FIG. 11

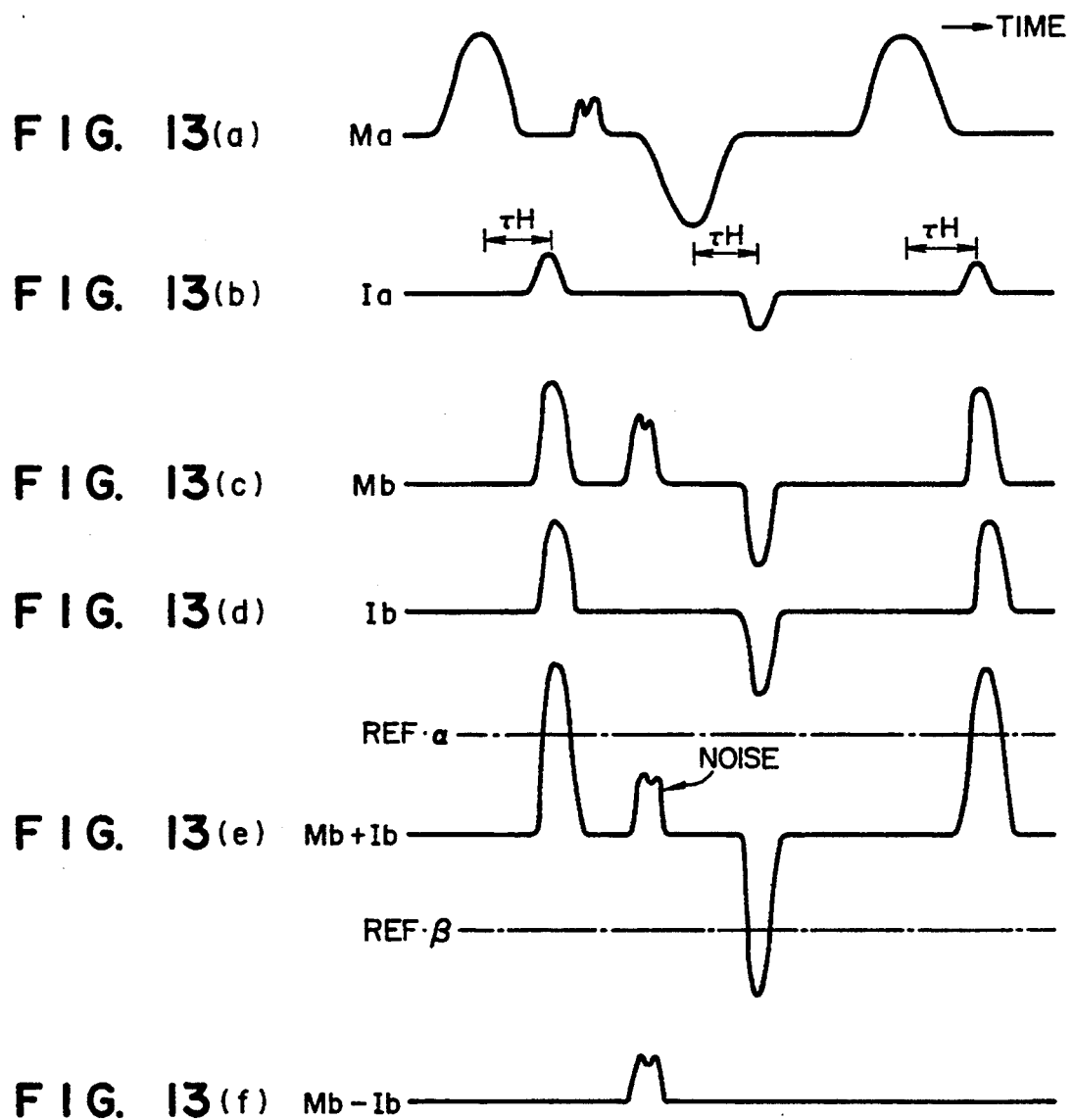

READ AND/OR WRITE INTEGRATED CIRCUIT HAVING AN OPERATION TIMING ADJUSTING CIRCUIT AND CONSTANT CURRENT ELEMENTS

BACKGROUND OF THE INVENTION

1. Field of the Invention

This invention relates to read and/or write integrated circuits, and more particularly to read and/or write integrated circuits suitable for use in a composite head which utilizes, for example, an MR (magnetoresistance effect element) head as a read head and an inductive head as a write head.

2. Description of the Related Art

As the prior art related to the present invention, JP-A-60-201505 and JP-A-63-257903 describe examples of driving circuits for magnetic heads; JP-A-57-172516, JP-A-60-136910, JP-A-61-170909 and JP-A-3-104006 describe circuits for detecting abnormalities in magnetic heads; and. JP-A-61-42706 describes a read circuit.

Further, examples of a read circuit using a MR head are disclosed in (1) David P. Swart, et al. ISSCC 93/Session 13/Hard Disk and Tape Drives/Paper FA 13.4, IEEE International Solid-State Circuits Conference, 1993, pp. 218–219, 291, and (2) K. B. Klaassen, "Magnetic Recording Channel Front-ends", IEEE Transactions on Magnetics, Vol. 27, No. 6, November 1991, pp. 4503–4508.

SUMMARY OF THE INVENTION

Magnetic disk drives have been increasingly required to realize a larger capacity of storage, higher operation speed, size reduction and higher reliability. To respond to these requirements, the present inventors have studied a read and/or write integrated circuit utilizing an MR head as a read head and an inductive head as a write head, and found, as a result of the studies, a variety of problems to be solved including realization of faster operations of a read circuit for accomplishing a faster and higher capacity disk drive, protection of elements employed therein from higher voltages required to perform the faster operation, highly accurate detection of abnormalities which possibly occur in the magnetic heads, and so on.

It is an object of this invention to provide a read and/or write integrated circuit including a read-associated. circuit capable of achieving a faster read operation.

It is another object of this invention to provide a read and/or write integrated circuit including a write-associated circuit capable of achieving a faster write operation.

It is a further object of this invention to provide a read and/or write integrated circuit including a circuit capable of detecting abnormalities in magnetic heads with a high accuracy.

It is a further object of this invention to provide a read and/or write integrated circuit which is provided with new functions corresponding to a composite head.

According to an aspect of the present invention, there is provided a read integrated circuit which includes a differential amplifier circuit for amplifying a read-out signal; an operation timing adjusting circuit responsive to operation mode signals indicative of an operation mode of the read integrated circuit for outputting first, second and third control signals; a switching element responsive to the first control signal for supplying the differential amplifier circuit with a power supply voltage for setting the differential amplifier circuit into operative state; a first constant current element, connected to a common emitter of the differential amplifier circuit and responsive to the second control signal to turn into operable state, the first constant current element further turning into operative state when the differential amplifier circuit is set into operative state in the operable state of the first constant current element, to cause a constant operating current to flow through the differential amplifier circuit;

an emitter-follower output transistor response to an output signal of the differential amplifier circuit to turn into operative state to output the read-out signal amplified by the differential amplifier circuit; and a second constant current element, connected to the emitter of the emitter-follower output transistor and responsive to the third control signal to turn into operable state, the second constant current element further turning into operative state, when the emitter-follower output transistor is set into operative state in the operable state of the second constant current element, to cause a constant operating current to flow into the emitter-follower output transistor, wherein the operation timing adjusting circuit outputs the first, second and third control signals so as to set the first constant current element, the switching element and the second constant current element into operative state in this order when the operation mode signals instruct the differential amplifier circuit to start an amplification operation and to set the second constant current element, the switching element and the first constant current element into inoperative state in this order when the operation mode signals instruct the differential amplifier circuit o stop the amplification operation.

According to the read integrated circuit configured, as described above, the timing adjusting circuit is provided for controlling operations of the second constant current element connected to the emitter-follower output transistor for outputting amplified read-out signals, the power switching element for supplying the differential amplifier circuit with an operating voltage and the first constant current element connected to the emitter of the differential amplifier transistor. Specifically, at a timing at which the differential amplifier circuit for amplifying read-out signals stops an amplification operation, the second constant current element, the power switching element and the first constant current element are stopped the operations thereof in this order. At a timing at which the differential amplifier circuit starts the amplification operation, they are turned on in the order reverse to the above.

More specifically, the timing adjusting circuit is provided such that, at a timing at which the differential amplifier circuit for amplifying read-out signals stops an amplification operation, the second constant current element connected to the emitter-follower transistor for outputting amplified read-out signals of the differential amplifier circuit, the power switching element for supplying the differential amplifier circuit with an operating voltage and the first constant current element connected to the emitter of the differential amplifier transistor are instructed to stop the operation in this order, while at a timing at which the differential amplifier circuit starts the amplification operation, they are turned on in the order reverse to the above, thereby preventing changes in potentials at DC blocking capacitors coupled to the read integrated circuit and achieving a fast read operation.

According to another aspect of the present invention, there is provided a read integrated circuit which includes a differential amplifier circuit for amplifying a read-out signal; an operation timing adjusting circuit responsive to operation mode signals indicative of an operation mode of the read integrated circuit for outputting first and second control signals; a switching element responsive to the first control signal for supplying the differential amplifier circuit with a power supply voltage for setting the differential amplifier circuit into operative state;

a constant current element connected to a common emitter of the differential amplifier circuit and responsive to the second control signal to turn into operable state, the constant current element further turning into operative state, when the differential amplifier circuit is set into operative state in the operable state of the constant current element, to cause a constant operating current to flow through the differential amplifier circuit; and an emitter-follower output transistor responsive to an output signal of the differential amplifier circuit to turn into operative state to output the read-out signal amplified by the differential amplifier circuit, wherein the operation timing adjusting circuit outputs the first and second control signals so as to set the constant current element and the switching element into operative state in this order when the operation mode signals instruct the differential amplifier circuit to start an amplification operation and to set the switching element and the constant current element into inoperative state in this order when the operation mode signals instruct the differential amplifier circuit to stop the amplification operation.

According to an example of the present invention, the emitter-follower output transistor has its output commonly connected to outputs of emitter-follower output transistors in at least one other read integrated circuit and also connected to a next stage through DC component cutting capacitors.

According to an example of the present invention, a read-out signal supplied to the differential amplifier circuit is a read-out signal from an exclusively designed read head formed of a magnetoresistance effect element.

According to a further aspect of the present invention, there is provided a write integrated circuit which includes a write head; a write current control circuit for controlling the polarity of a write current to the head in accordance with data to be written and supplying the write current to the head; a clamp voltage generator circuit for generating a clamp voltage and supplying the same to the current control circuit; a shifting unit for shifting the clamp voltage to a level substantially equal to a potential at the head; and damping resistors connected between the head and the shifting unit.

According to the write integrated circuit thus configured, since the damping resistors in a magnetic head driving circuit are disposed between the head terminals and the clamp section in that circuit, resistors of a smaller resistance values may be employed, whereby an overshoot amount is reduced and the write current does not flow through the damping resistors, with the result that a fast write operation is achieved.

According to a further aspect of the present invention, there is provided a write integrated circuit which includes two pairs of differential transistors receiving a first reference voltage formed on the basis of a current corresponding to a write current and voltages at one and the other terminals of a write magnetic head, respectively; first constant current sources connected to the respective collectors of the two pairs of differential transistors for passing a first constant current smaller than a second constant current into the two pairs of differential transistors; second constant current sources connected to the respective common emitters of the two pairs of differential transistors for passing the second constant current larger than the first constant current into the two pairs of differential transistors; capacitors connected to the respective collectors of the two pairs of differential transistors; a clamp circuit for clamping potentials at the collectors of the two pairs of differential transistors at a predetermined voltage lower than a second reference voltage; a group of transistors connected in parallel for receiving collector voltages of the two pairs of differential transistors, respectively; a transistor element differentially arranged with the transistor group and receiving the second reference voltage higher than a clamp voltage of the clamp circuit; and an abnormality detector circuit for producing a signal indicative of an abnormality from the common collectors of the transistor group.

According to the write integrated circuit configured as described above, a reference voltage, formed on the basis of a current corresponding to a write current, is used. Voltages at both terminals of the magnetic head are supplied to the two differential transistor circuits, respectively. Relatively small current is supplied to each of differential transistors constituting the differential transistor circuits from the collector. A constant current source is connected to the common emitter of each differential transistor circuit for generating a sufficiently large current as compared with the current supplied from the collector. A voltage clamp circuit is connected to the respective collectors of the differential transistors. Respective collector voltages of the two pairs of differential transistors are supplied to the bases of the four parallelly arranged transistors. By a providing transistor arranged in a differential form with these transistors and receiving a reference voltage set at a higher voltage by a clamp voltage generated by the clamp circuit, an abnormality detecting signal is derived from the common collectors of the four transistors or from the collector of a transistor arranged in a differential form therewith.

Stated another way, by utilizing changes in potentials at both magnetic head terminals during a write operation to provide a large difference between a current from the collector side and a current from the emitter side as well as by providing the clamp circuit, short-circuiting or fixed voltage will cause a collector voltage of any transistor to deviate from the clamp voltage, whereby the short-circuiting or fixed voltage can be detected.

According to an example of the present invention, a write integrated circuit further includes a pair of transistors having the bases connected to one and the other terminals of the write magnetic head, respectively, and the collectors and emitters connected in common; another transistor element arranged in a differential form with the pair of transistors, the transistor element being supplied at the base with a third predetermined reference voltage higher than a normal potential; and an abnormality detector unit for outputting an abnormality detecting signal indicating that the head is in open state from common collectors of the pair of transistors.

According to the write integrated circuit thus configured, the pair of transistors supplied at the bases with voltages presenting at one and the other of the head and having the collectors and emitters commonly connected, and the transistor arranged in a differential form with the pair of transistors and supplied at the base with the predetermined reference voltage higher than normal voltages at the magnetic head terminals are provided inn order to generate the abnormality detecting signal indicative of an opened head from the commonly connected collectors of the pair of transistors or from the collector of the transistor arranged in the differential form with the pair of the transistors.

Thus, by providing the transistor which is supplied at the base with the predetermined reference voltage higher than normal voltages at the magnetic head terminals, together with the pair of transistors which are supplied at the bases with voltages at one and the other terminals of the magnetic head and have the collectors and emitters connected in common, abnormality caused by the head being opened can be detected by sensing a higher output voltage from a write driver.

According to a further aspect of the present invention, there is provided a read and/or write integrated circuit which includes an exclusively designed read head made of a magnetoresistance effect element; a write magnetic head; a first read circuit connected to the exclusively designed read head for deriving a read-out signal from the exclusively designed read head; a second read circuit connected to the write magnetic head for deriving a read-out signal from the write magnetic head; and a unit having a unit for comparing the read-out signals from the first and second read circuits for outputting a signal indicative of a comparison result as a signal for detecting errors in the read-out signal from the exclusively designed read head or a signal for correcting errors.

According to the read and/or write integrated circuit as described above, the exclusively designed read head made of a magnetoresistance effect element and the write magnetic head are provided, and a read circuit is added to the write magnetic head so as to output read-out signals therefrom in a read mode, the signals being used for detecting errors in read-out signals from the exclusively designed read head or for detecting and correcting such errors.

Thus, a read circuit is added to an exclusively designed write head so as to output read-out signals in the read mode, and the signals are used to make it possible to detect errors in read-out signals from the exclusively designed read head or correct such detected errors.

According to an example of the present invention, the output unit comprises a timing adjusting circuit for coinciding output timings of read-out signals from the first and second read circuits, and the timing adjusting circuit provides the comparator unit with the read-out signals from the first and second read circuits at the same output timing.

BRIEF DESCRIPTION OF THE DRAWINGS

FIG. 5 is a circuit diagram showing an embodiment of a timing adjusting circuit 4 in FIG. 1;

FIGS. 6(a)-FIG. 6(i) are a timing chart for explaining the operation of the timing adjusting circuit of FIG. 5;

FIGS. 8(a)-FIG. 8(d) are a waveform chart for explaining an exemplary operation of an abnormality detector circuit in FIG. 7;

FIGS. 10(a)-FIG. 10(b) are a waveform chart for explaining an exemplary operation of the write circuit of FIG. 9;

FIG. 11 is a block diagram showing a main portion of another embodiment of the read and/or write integrated circuit according to the present invention;

FIGS. 13(a)-FIG. 13(f) are a waveform chart for explaining exemplary signal processing in the embodiment of FIG. 12;

DESCRIPTION OF THE PREFERRED EMBODIMENTS

The read and/or write integrated circuits according to the present invention will hereinafter be described in detail in connection with preferred embodiments thereof with reference to the accompanying drawings.

Figure 1:
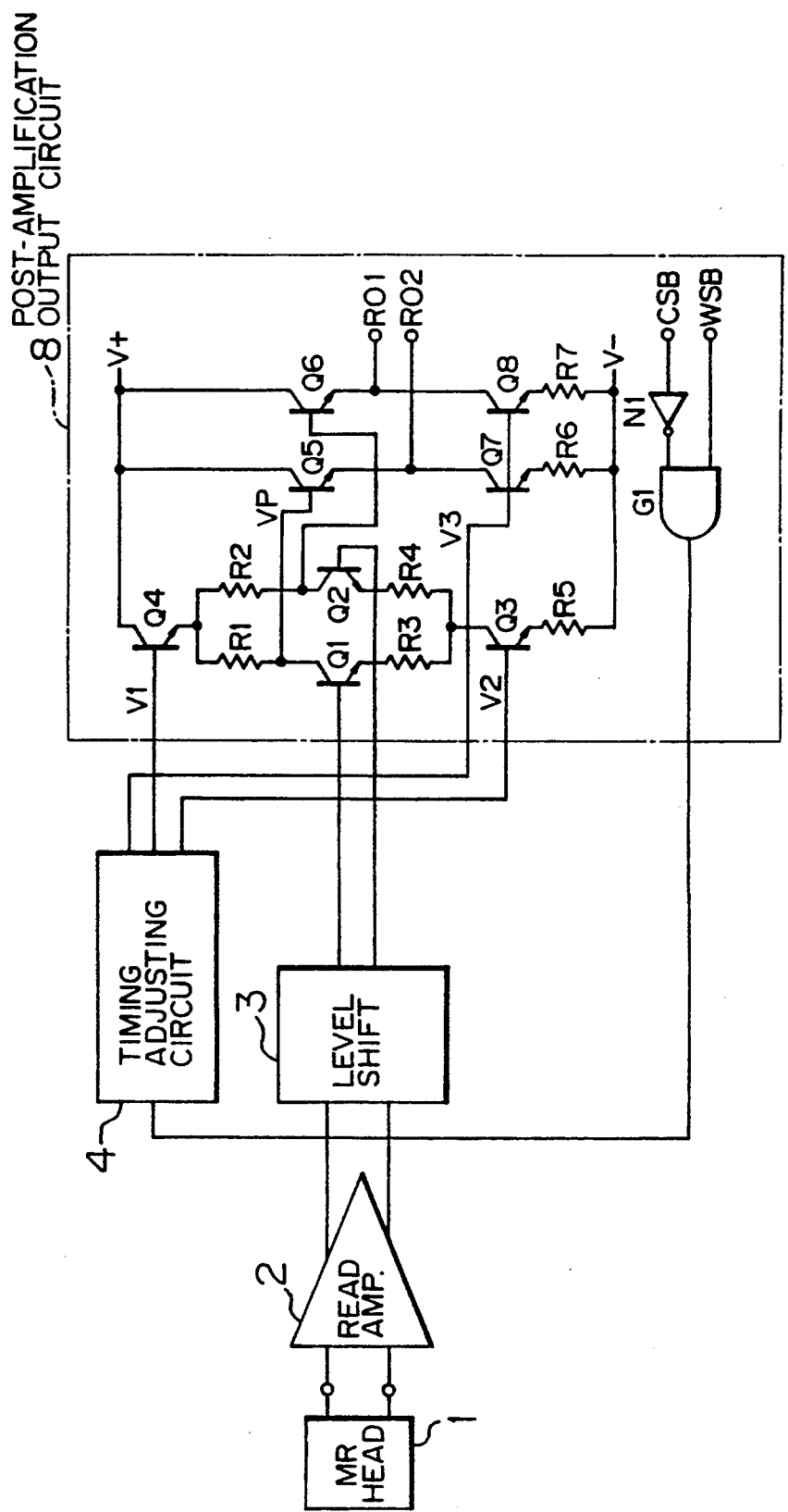
FIG. 1 is a circuit diagram showing a main portion of an embodiment of a read-associated circuit included in a read and/or write integrated circuit according to the present invention.

FIG. 1 shows in a circuit diagram form a main portion of an embodiment of a read-associated circuit included in the read and/or write integrated circuit according to the present invention. Each of circuit blocks shown in FIG. 1 is formed on a single semiconductor substrate such as a monocrystalline silicon together with other circuit components constituting the read and/or write integrated circuit by known semiconductor integrated circuit manufacturing techniques.

Thought not particularly limited, the read and/or write integrated circuit of this embodiment may be employed in a magnetic hard disk drive. FIG. 1 illustratively shows a circuit corresponding to an MR head as being representative of a plurality of circuits provided in the read and/or write integrated circuit.

A read-out signal from an MR head is inputted to a read amplifier 2 to be amplified therein. An output signal from the read amplifier 2 is supplied to the bases of differential transistors Q1 and Q2 forming a post amplifier through a level shifter 3. The level shifter 3 provides an output signal thereof with a relative level shift amount different from those provided by read amplifiers for amplifying read-out signals from other HR heads, not shown, such that an output signal corresponding to a selected head is supplied to the bases of the differential amplifiers Q1 and Q2. When one is selected from a plurality of MR heads, the read amplifier 2 corresponding to the one MR head to be selected is turned on. In other words, the selection of a head is made by a control of turning on and off the read amplifier corresponding to the head.

A differential amplifier circuit, for example, a differential transistor circuit constituting the post amplifier is composed of load resistors R1, R2 connected to the collectors of the differential amplifiers Q1, Q2, respectively; emitter resistors R3, R4; a transistor Q4 acting as a power switch for controlling the supply of an operating voltage +V to a connection point of the load resistors R1 and R2; and a constant current transistor Q3 acting as a first constant current element for conducting an operating current (bias current) to the emitters of the differential transistors Q1 and Q2 commonly connected through the emitter resistors R3, R4. The transistor Q4 as the power switch is supplied at the base with a control signal V1. The constant current transistor Q3 is provided with a resistor R5 connected to the emitter and is selectively supplied at the base with a constant voltage V2 such that the transistor Q3 also performs a switching operation.

Output signals from the collectors of the differential transistors Q1, Q2 are supplied to the bases of emitter-follower output transistors Q5, Q6, respectively. These emitter-follower output transistors Q5, Q6 are provided with transistors Q7, Q8 which are connected to the emitters as constant current loads thereof, i.e., second constant current elements. These transistors Q7, Q8 are provided with emitter resistors R6, R7 connected to the respective emitters, and are selectively supplied at the respective bases with a constant voltage V3 such that the transistors Q7, Q8 also perform a switching operation similarly to the above-mentioned transistor Q3. The emitters of the emitter-follower transistors Q5, Q6 are connected to output terminals RO1, RO2, respectively. It should be noted that while this embodiment includes one set each of the emitter-follower transistors Q5, Q6 and the constant current elements Q7, Q8, either one of these sets may only be included.

Figure 3:
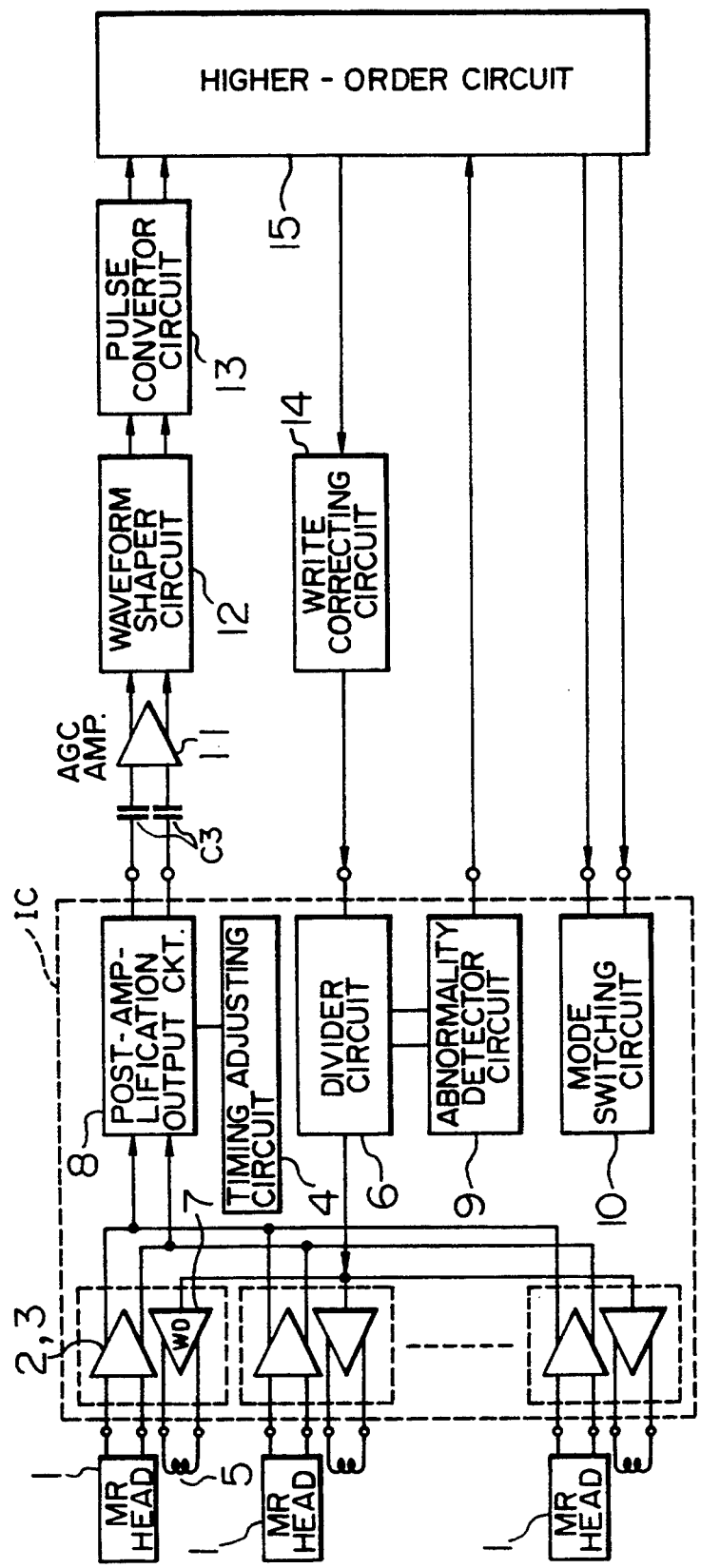
FIG. 3 is a block diagram showing the whole configuration of a read and/or write integrated circuit according to one embodiment of the present invention.

FIG. 3 shows in a block diagram form an embodiment of a read and/or write integrated circuit according to the present invention and an external circuit associated therewith. This read and/or write integrated circuit comprises a plurality of head circuits. Specifically, in addition to the MR head 1 and the associated read preamplifier 2, seven MR heads and associated read pre-amplifiers, for example, may be included in the read and/or write integrated circuit such that a single post-amplification output circuit 8 is shared by a total of the eight circuits each including the MR head 1 and the read pre-amplifier 2. It should be understood that the illustrated read pre-amplifier 2 also includes the level shifter 3.

A pair of output signals of the post-amplification output circuit 8 is supplied to an AGC (Automatic Gain Control) amplifier 11 through capacitors 3 each having a relatively large capacity so as to cut DC output offsets of the respective output signals. Output signals of the AGC amplifier 11 are waveform-shaped by a waveform shaper circuit 12, converted into pulse signals by a pulse convertor circuit 13, and transmitted to a higher-order circuit 15 such as a magnetic disk control circuit or the like.

For increasing the storage capacity of a magnetic disk drive, a plurality of the read and/or write integrated circuits IC are provided so that the post-amplifier 8 has its output terminals commonly connected to those of the other read and/or write integrated circuits. In order to allow an output signal of a selected read and/or write integrated circuit only to be transmitted to the AGC amplifier 11 through the capacitors C3, the post-amplification output circuit 8 is provided with a tri-state output function. Stated another way, a post-amplification output circuit 8 of a read and/or write integrated circuit IC placed in a non-selected state has its output in high-impedance condition.

Referring back to FIG. 1, the timing adjusting circuit 4, which acts as an operation timing adjusting circuit, turns off the switching transistor Q4 and the constant current transistors Q3 and Q7, Q8, when the associated read and/or write integrated circuit IC is in non-selected state, so as to present a high impedance condition at the output terminals RO1, RO2. If voltages at the output terminals RO1 and RO2 fluctuate when the post-amplification output circuit 8 is switched from operative state to inoperative state or, contrary to this, from inoperative state to operative state, this will result in a delayed switching operation due to times required to charge and discharge the coupling capacitors C3 for cutting DC output offsets. To avoid this inconvenience, the timing adjusting circuit 4 sets timing differences to the control signals V1–V3 based on control signals CSB and WSB in the following manner.

The chip select signal CSB is supplied to one input of an AND gate circuit G1 through an inverter circuit N1, while the write select signal WSB is supplied to the other input of the AND gate circuit G1. An output signal of the AND gate circuit G1 is supplied to the timing adjusting circuit 4. A chip selected state is present when the chip select signal CSB is at low level. One of plural heads as mentioned above is selected by a head select signal, not shown. Further, if the write select signal WSB is at high level, a read mode is instructed as an operation mode so that the output signal of the AND gate circuit G1 is shifted to high level to set the post-amplification output circuit 8 into operative state. If the write select signal WSB is at low level, a write mode is instructed as an operation mode so that the output signal of the ANG gate circuit G1 is shifted to low level, whereby the post-amplification output circuit 8 is set into high impedance condition. Also, if the chip select signal CSB is shifted to high level, indicative of a chip non-selecting state (idling state), the output signal of the inverter N1 goes to low level so that the output signal of the AND gate circuit G1 is shifted to low level as is the case of the write mode, whereby the post-amplification output circuit 8 presents a high impedance condition at its output.

Figure 4:
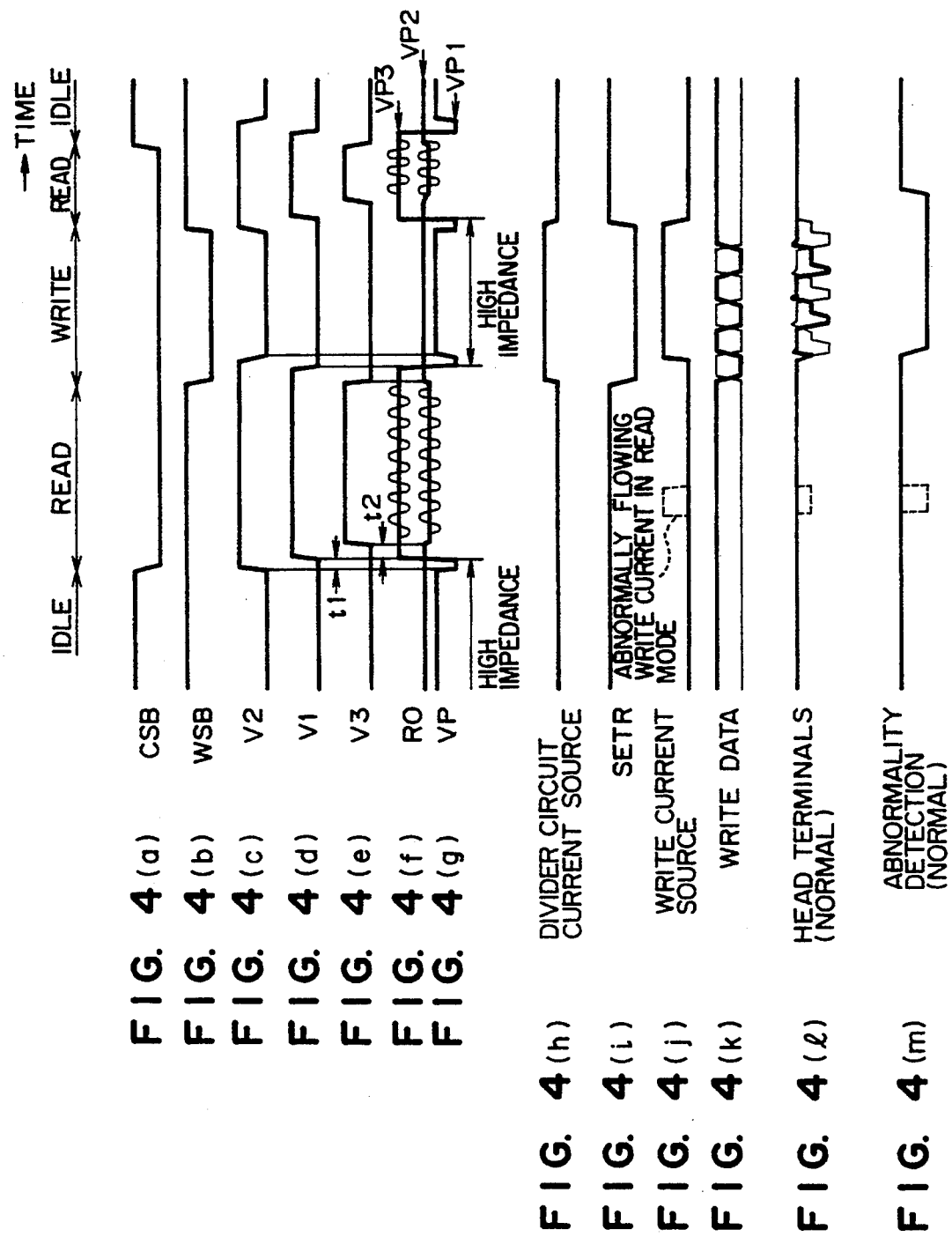
FIGS. 4(a)-FIG. 4(m) are a timing chart for explaining exemplary operations of the read and/or write integrated circuit shown in FIG. 3.

FIG. 4 shows a timing chart for explaining an exemplary operation of the read and/or write integrated circuit according to the present invention. The chart illustratively indicates a series of switching operations from an idle state through a read state, writ state and read state to another idle state.

In the idle state with the write select signal WSB at high level and the chip select signal CSB at low level, the output signal of the AND gate circuit G1 shown in the circuit diagram of FIG. 1 goes to low level, while the timing adjusting circuit 4 sets the control signals V1-V3 to low level to turn off the transistors Q4, Q3, Q7, Q8, so that the output of the read and/or write integrated circuit presents a high impedance condition.

If the chip select signal CSB only changes to low level, the operation mode of the circuit is determined to be the read mode. This causes the post-amplification output circuit 8 to be switched from inoperative state to operative state. At this time, the control signal V2 is shifted to high level, as shown in the timing chart of FIG. 4(c), thereby causing a constant current to flow through the constant current transistor Q3 in the differential transistor circuit. Since the switching transistor Q4 remains in off-state in this event, the collector output voltages VP of the differential transistors Q1, Q2 are reduced in response to the bias current flowing therethrough.

In response to the reduced output voltage VP of the differential transistor circuit, the base voltages of the emitter-follower output transistors Q5, Q6 are also decreased. Therefore, the output transistors Q5, Q6 of the output circuit 8, which is going to begin operating, are prevented from being undesirably turned on due to voltages at external circuits (DC cutting capacitors C3) connected to the output terminals RO1, RO2.

Subsequently, the control signal V1 is shifted to high level with a time difference t1 from the high-level shift of the control signal V2. In response to the control signal V1 shifted to high level, the power switching transistor Q4 of the differential transistor circuit (post-amplification) is turned on, so that the potential of its output signal VP is raised to a predetermined level.

Finally, the control signal V3 is shifted to high level with a time difference t2 from the high-level shift of the control signal V1, which causes a bias current to flow through the emitter-follower output transistors Q5, Q6, with the result that a read-out signal is outputted from a selected MR head.

When the write select signal WSB changes to low level, the operation mode is switched from the read mode to the write mode. This results in switching the post-amplification output circuit 8 from the operative mode to the inoperative mode. At this time, the control signal V3 is first shifted to low level as shown in the timing chart of FIG. 4(e), contrary to the above-mentioned change from the idle state to the read mode. Since the low level control signal V3 turns off the constant current transistors Q7, Q8, the emitter-follower output transistors Q5, Q6 are turned off immediately after the output terminal R0 is slightly charged up.

Subsequently, the control signal V1 is shifted to low level with a time difference similar to the above from the low-level shift of the control signal V3. In response to the control signal V1 changing to low level, the power switching transistor Q4 of the differential transistor circuit (post-amplification) is turned off, whereby the output signal VP thereof is shifted to a lower potential corresponding to the operating current of the constant current transistor Q3 on the emitter side. As a result, the output transistors Q5, Q6 are turned off to present a high impedance condition at the output terminals RO1, RO2.

Finally, the control voltage V2 is shifted to low level with a time difference similar to the above from the low-level shift of the control signal V1, which results in turning off the constant current transistor Q3 of the differential transistor circuit. Collector potentials of the differential transistors Q1, Q2 are recovered to predetermined levels by virtue of charges (reverse current) from the base sides.

When the write select signal WSB again changes to high level, the operation mode is switched from the write mode to the read mode. Also in this event, the control signals V2, V1, V3 are shifted to high level in this order (V2→V1→V3) so as to deliver a read-out signal without changing a DC voltage component of an output signal at the output terminal RO.

Then, when the chip select signal CSB changes to high level, the operation mode is switched from the read mode to the idle mode. Also in this event, the control signals V3, V1, V2 are shifted to low level in this order (V3→V1→V2), as is the case of the above-mentioned switch to the write mode, so as to present a high impedance condition at the output RO without changing the DC voltage component of an output signal at the output terminal RO.

FIG. 5 is a circuit diagram showing an example of the timing adjusting circuit 4. As described above, an inverted signal A is formed by the inverter circuit N1 which receives the chip select CSB. A control signal B is formed by the AND gate G1 which receives the signal A and the write select signal WSB. This control signal B in turn is converted to a signal C by a delay circuit DL1, and the signal C is further converted to a signal D by a delay circuit DL2. The signals C, B are supplied to an OR gate circuit G6 to form the control signal V2. The signal C, as it is, is also outputted through a buffer amplifier BA as the control signal V1. Further, the signals D, B are supplied to an AND gate G5 to form the control signal V3.

FIG. 6 shows a timing chart for explaining the operation of the exemplary circuit illustrated in FIG. 5. The signal A is an inverted version of the chip select signal CSB. If the chip select signal CSB changes to low level with the write select signal WSB remaining at high level, the signal A changes from low level to high level. This causes the output signal B of the AND gate G1 to change from low level to high level.

When the signal B changes to high level, the control signal V1, in response, changes to high level through a NOR gate circuit G6. The signal C changes to high level in a delay time provided by the delay circuit DL1 after the signal B has changed to high level. This causes the control signal V1 to change to high level through the buffer amplifier BA. The signal D changes to high level in a delay time provided by the delay circuit DL2 after the signal C has changed to high level. As a result, both the inputs B, D to the AND gate circuit G5 are at high level, so that the control signal V3 changes to high level. In this manner, when the read mode is entered, the control signals V1-V3 are shifted to high level in the order of V2→V1→V3 to set into the read mode.

When the write select signal WSB changes to low level to switch the operation mode from the read mode to the write mode, the output signal B of the AND gate circuit G1 changes to low level. When the signal B changes to low level, the control signal V3 is first shifted to low level by the AND gate circuit G5. The signal C changes to low level in the delay time provided by the delay circuit DL1 after the signal B has changed to low level. This causes the control signal V1 to change to low level through the buffer amplifier BA. The signal D changes to low level in the delay time provided by the delay circuit DL2 after the signal C has changed to low level. As a result, both the inputs B, D to the NOR gate circuit G6 are at low level, so that the control signal V2 changes to low level. In this manner, when the write mode is entered, the control signals V1–V3 are shifted to low level in the order of V3→V1→V2, that is, in the reverse order to the case of entering the read mode.

Figure 14:
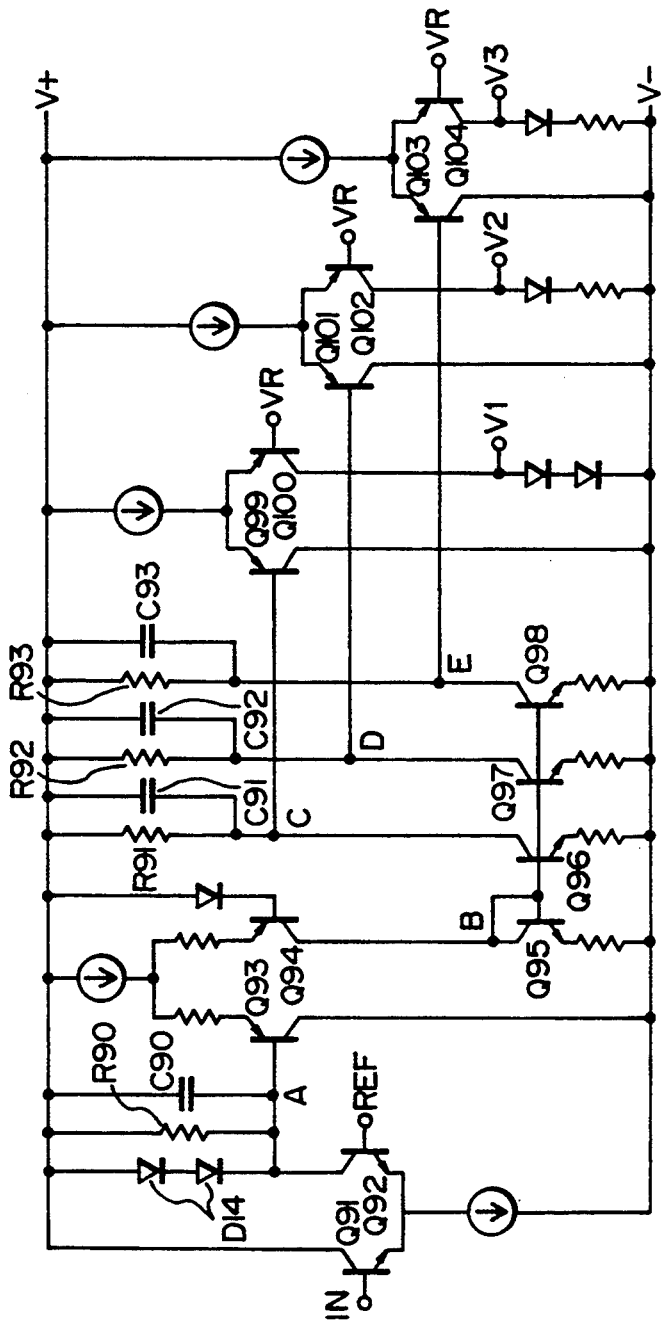
FIG. 14 is a circuit diagram showing another embodiment of the timing adjusting circuit in FIG. 1.

FIG. 14 is a circuit diagram showing another example of the timing adjusting circuit 4. In this embodiment, the control signals V1–V3 as described above are formed by analog signal processing.

An input terminal IN is supplied with the above-mentioned signal B. Therefore, this signal B will be referred to as the signal IN in the following explanation. The signal IN is supplied to differential transistors Q91, Q92 together with a reference voltage REF. The differential transistors Q91, Q92 are provided with a constant current source which is connected to the emitters thereof. The differential transistor Q92 is also provided with a time constant setting circuit composed elf a resistor R90 and a capacitor C90, which is connected to the collector. With this configuration, the transistor Q92 produces at its collector the signal A which is in phase with the input signal IN, and a rising edge of which is delayed from the input signal IN by a time constant defined by these resistor R90 and capacitor C90. Specifically, when the input signal IN changes to high level, the transistor Q91 is turned on, and the transistor Q92 is turned off, charges accumulated in the capacitor C90 are discharged by the resistor R90, so that the signal A rises to high level. Conversely, when the input signal IN changes to low level, the transistor Q92 is turned on, a constant current is branched into the resistor R90 and the capacitor C90, whereby the signal A lowers, at a relatively later time, to $2V_F$ at which a diode D14 is turned on ($V_F$: forward voltage of the diode D14).

The signal A as described above is shifted by a differential circuit composed of PNP transistors Q93, Q94 to a low level signal which is used as the signal B. This signal B is converted into a current signal by a current mirror circuit, and is also used by time constant setting circuits respectively composed of R91 and C91; R92 and C92; and R93 and C93 and connected to the collectors of mirror output transistors Q96, Q97, Q98, to generate voltage signals C, D, E which rise and fall at different timings from each other. In this configuration, the time constant setting circuits may be formed to provide different time constants from each other, for example, by using the capacitors C91–C93 having an identical capacitance value and resisters R91–R93 having resistance values, the relation of which is expressed by R92<R91<R93, such that the signals D, C, E rise and fall in this order at different intervals.

The voltage signals D, C, E generated as described above are compared with a reference voltage VR set at substantially one-half of their voltage swing by voltage comparators composed of differential transistors Q99, Q100; Q101, Q102; and Q103, Q104, respectively. Thus, the voltage comparator circuits generate the control signal V2, V1, V3, respectively, which change the levels in the order described above.

By controlling the post-amplification output circuit 8 by the timing adjusting circuit 4 as described above, changes in output DC potential can be reduced to a minimum when the operation mode of the post-amplification output circuit 8 is to be switched. This results in reducing a time required to charge and discharge the capacitors C3 connected to the post-amplification output circuit 8 for cutting DC components, thus enabling the mode switch to be performed at a higher speed.

More specifically, the read-associated circuit of the read integrated circuit comprises a differential amplifier circuit (Q1, Q2) for amplifying a read-out signal from a read head; an operation timing adjusting circuit (4) responsive to operation mode signals (WSB, CSB) indicative of an operation mode of the read integrated circuit for outputting first, second and third control signals (V1, V2, V3); a power switching element (Q4) responsive to the first control signal (V1 at high level) for supplying the differential amplifier circuit with a power supply voltage (V+) for setting the differential amplifier circuit in operative state; a first constant current element (Q3) connected to the common emitter of the differential amplifier circuit and responsive to the second control signal (V2 at high level) to turn into operable state (on-state), in which state the first constant current element becomes operative, when the differential amplifier circuit is set in operative state, to cause a constant operating current to flow through the differential amplifier circuit; an emitter-follower output transistor (Q5, Q6) responsive to an output signal (VP) of the differential amplifier circuit to turn into operative state to output the read-out signal amplified by the differential amplifier circuit; and a second constant current element (Q7, Q8) connected to the emitter of the emitter-follower output transistor and responsive to the third control signal (V3 at high level) to turn into operable state (on-state), in which state the second constant current element becomes operative when the emitter-follower output transistor is set into operative state, to cause a constant operating current to flow through the emitter-follower output transistor, wherein the operation timing adjusting circuit outputs the first, second, and third control signals (high level, low level) so as to set the first constant current element, the switching element, and the second constant current element into operative state in this order when the operation mode signals instruct the differential amplifier circuit to start an amplification operation, and so as to set the second constant current element, the switching element, and the first constant current element into inoperative state (off-state) in this order when the operation mode signals instruct the differential amplifier circuit to stop the amplification operation.

Figure 15:
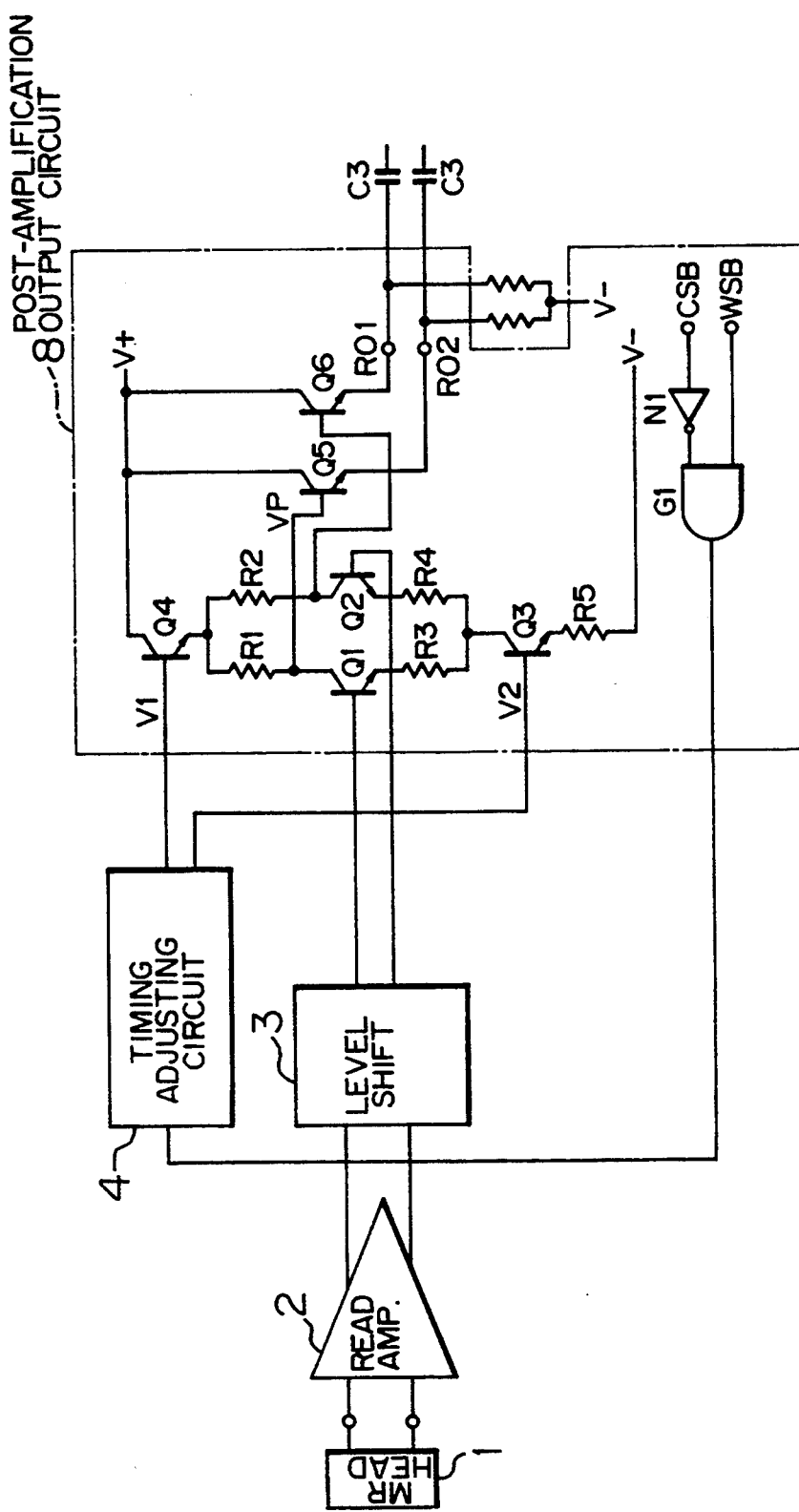
FIG. 15 is a circuit diagram showing a main portion of another embodiment of a read-associated circuit included in the read and/or write integrated circuit according to the present invention.

FIG. 15 shows another embodiment of the read-associated circuit which is a modification of the read circuit illustrated in FIG. 1. Specifically, the constant current elements Q7, Q8 in the circuit of FIG. 1 are omitted in FIG. 15. The operations performed by the circuit of FIG. 15 are identical to those by the circuit of FIG. 1, except that the signal V3 is not generated in the operations performed by the timing adjusting circuit in FIG. 1.

In a timing adjusting circuit of the embodiment shown in FIG. 15, at a timing at which a differential transistor circuit (Q1, Q2), which serves as a differential amplifier circuit for amplifying read-out signals, stops its amplification operation, a transistor Q4 which is a power switching element for supplying the differential transistor circuit with an operating voltage, and a first constant current element (Q3) connected to the common emitter of the differential amplifier circuit are forced to stop the operations in this order, whereas at a timing at which the differential amplifier circuit starts its amplification operation, the transistor Q4 and the first constant current element or transistor Q3 are turned on in the order reverse no the above, which leads to preventing changes in voltages across DC blocking capacitors coupled to the emitter follower transistors, thus enabling the read circuit to carry out a faster read operation.

Figure 2:
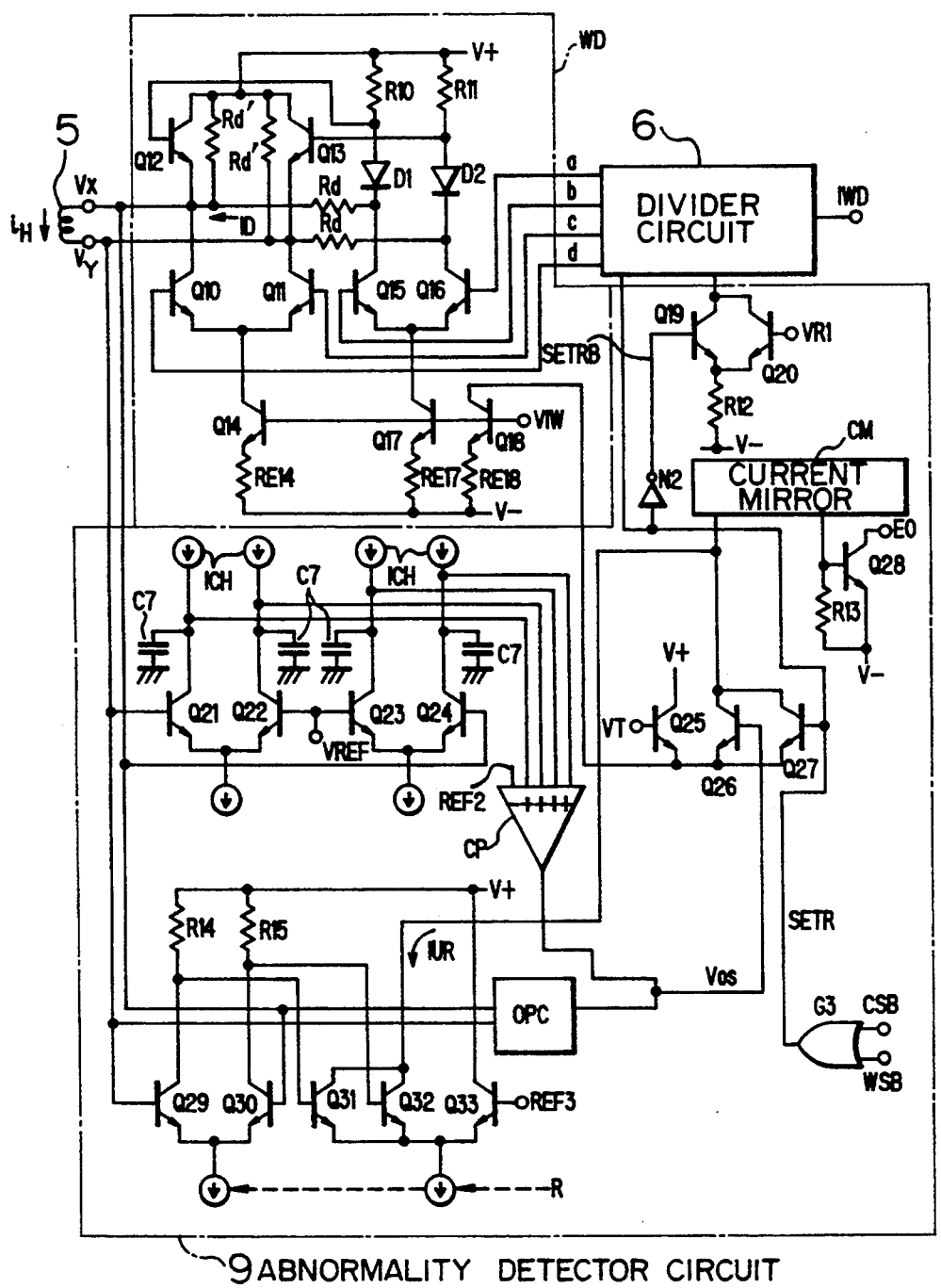
FIG. 2 is a circuit diagram showing a main portion of an embodiment of a write-associated circuit included in the read and/or write integrated circuit according to the present invention.

FIG. 2 is a circuit diagram showing a main portion of an embodiment of a write-associated circuit included in the read and/or write integrated circuit according to the present invention. A signal supplied to a write data terminal IWD is inputted to a divider circuit 6 for data input. Output signals a–d of the divider circuit 6 are commonly delivered to inputs of a plurality of write drivers (WD) 7, such that a write driver WD corresponding to a magnetic head 5 selected by a selection signal VIW is made operative to drive the corresponding magnetic head 5.

The divider circuit 6 is designed to have its current source supply an extremely small amount of current during operations other than a write operation to reduce consumed power, and supply a normal current only during the write operation. More specifically, a signal SETRB is shifted to low level when no write operation is performed to turn off a transistor Q19. As a result, an extremely small current defined by a reference voltage VR1 is formed by a transistor Q20 and supplied to the divider circuit 6. During a write operation, the signal SETRB is at high level, so that a normal operating current formed by the transistor Q19 is supplied to the divider circuit 6.

Write data divided by the divider circuit 6 have their levels shifted to the differential signals a, b, c, d and are inputted to a write amplifier. The output signals a, b of the divider circuit 6 are supplied to the bases of differential transistors Q16, Q15, respectively. Collector outputs of these transistors Q16, Q15 are delivered to the bases of transistors Q13, Q12, respectively. These transistors Q12, Q13 and differential transistors Q11, Q10 receiving the output signals c and d respectively from the divider circuit 6 are connected in bridge configuration in order to change the direction of a write current flowing through the magnetic head 5. More specifically, the transistors Q12, Q11, forming a pair, are tuned on together to cause the write current to flow through the magnetic head 5 in one direction, whereas the transistors Q13, Q10, forming a pair, are turned on together to cause the write current to flow through the magnetic head in the other direction. Thus, the transistors Q10–Q13 function as a circuit for controlling the direction of the write current (polarity).

The write current is set by a transistor Q14 receiving the selection signal (control signal) VIW and a resistor RE14 connected to the emitter of the transistor Q14. The level of the write current is varied by the signal VIW. Also, a transistor Q17 receiving the same control signal VIW and an emitter resistor RE17 form a constant current, the level of which is however varied by the write current. This constant current is delivered to the emitters of the differential transistors Q15, Q16 through resistors R10, R11 and diodes D1, D2. In this manner, a clamp voltage corresponding to the write current is generated and supplied to the base of the transistor Q12 or Q13. The diodes D1, D2 shift the level of the clamp voltage to a level substantially equal to a head terminal voltage Vx or Vy, respectively.

For achieving a faster write operation, it is necessary to switch a current iH flowing through the magnetic head 5 at a higher speed. For switching the current $i_H$ at a higher speed, a voltage difference V between both the head terminals should be made larger, as is understood from an equation representing the voltage difference $V = L_H(di_H/dt)$, where LH is inductance of the magnetic head 5.

If a damping resistor Rd is connected between both the terminals of the magnetic head 5 or between the power supply voltage and each head terminal, a current ID flowing through the damping resistor Rd is expressed by ID=V/Rd upon switching the current $i_H$. For a faster switching operation, the voltage difference V should be larger, however, the resistor Rd should be smaller for suppressing an over-shoot amount. This relation means that the current ID becomes larger, and contradictorily insinuates that a write current flowing through the magnetic head is decreased corresponding to the increasing current ID.

To solve this inconvenience, this embodiment inserts damping resistors Rd between the magnetic head and a voltage clamp circuit. More specifically, level shifting diodes D1, D2 are disposed in a voltage clamp circuit (composed of R10, A11, RE17, Q15, Q16 and Q17) to create the same potentials as those at the emitters of the transistors Q12, Q13, and the damping resistors Rd are connected to the respective diodes D1, D2.

The damping resistor Rd is originally provided for suppressing current over-shoot when a current to the magnetic head 5 has been switched to cause a normal current to flow therethrough, so that it is not required when the current is to be switched (when the voltage V is generated). Thus, the damping resistors Rd are connected between the magnetic head 5 and the clamp circuit (a circuit for generating the voltage V) in this embodiment. Since with this configuration, the magnetic head terminal and the clamp circuit are at the same potential level, the current ID flowing through the dumpling resistors is substantially zero. Therefore, when a current switching operation is completed, a voltage across the magnetic head 5 recovers to a normal level, and the current ID flows into the magnetic head 5 by means of the dumpling resistors Rd to suppress over-shoot. As a result of reducing the unnecessary current ID to substantially zero upon switching the current to the magnetic head, the above-mentioned contradictory relation of a larger voltage V and smaller dumpling resistors Rd can be realized.

If separate heads are used for recording and reproducing as the read MR head and write head (inductance head) of this embodiment, a detecting function is required for detecting abnormalities in the write head when data is being read out. It will be understood that if a single head is used for reading and writing as before, a fault in the head will result inevitably in reading errors, so that a special abnormality detecting function as mentioned above is not necessary.

In this embodiment, a current branched from a write current, which is formed by a transistor Q18, and a mode switching signal SETR formed by an OR gate circuit G3 are logically processed by a transistor Q27 in order to detect an erroneous operation that the write current flows during the read mode.

Specifically explaining, in the read mode, an output signal of the OR gate circuit G3 goes to high to turn on the transistor Q27. In this event, when the write current is formed from the voltage VIW, this current passes through the transistor Q27, a current mirror CM, and a resistor R13 to turn on a transistor Q28. With this configuration, if an abnormal state occurs such as the write current flowing into the magnetic head during a read operation as indicated by broken lines in FIGS. 4(j), 4(e), 4(m), an error signal EO is shifted to low level.

Since the write current does not flow in a normal state during the read mode, the error signal EO is maintained at high level.

Two sets of differential transistors Q21, Q22 and Q23, Q24 and capacitors C7 connected to the respective collectors form a timer circuit. Specifically, the differential transistors Q22, Q23 in the respective sets are supplied at the respective bases with a reference voltage VREF, while the other differential transistors Q21, Q24 are supplied at the respective bases with voltages at one and the other terminals of the magnetic head 5. Common emitters of the differential transistors Q21, Q22 and Q23, Q24 are each connected to a constant power source.

While the operations of this timer circuit and a voltage comparator circuit CP for comparing an output voltage of the timer circuit will be explained later in detail with reference to FIG. 7, their general operations may be roughly explained as follows.

In a normal write operation, the terminal voltage of the magnetic head swings in response to the write signal between high and low levels relative to the reference voltage VREF, so that the differential transistors Q21, Q22 and Q23, Q24 are alternately turned on. For this reason, the capacitors C7 connected to the collectors of these transistors are discharged by the constant power source connected to the emitters of the transistors, and therefore remain at low level.

On the other hand, if an abnormality such as short-circuiting of both the terminals of the magnetic head 5 or short-circuiting of the magnetic head with power supply has occurred, the alternate turning-on of the differential transistors are not performed. Instead, the potential at at least one of the capacitors C7 is reduced to be lower as compared with a constant current from the constant power source on the emitter side and is therefore charged by this constant current. Consequently, the potential at this capacitor is determined as being at high level by the voltage comparator circuit CP. Since the voltage comparator circuit CP forms an output signal at low level when determining that the capacitor is at high level, a signal $V_{OS}$ at low level is supplied to the base of the transistor Q26. This results in turning off the transistor Q26 and also turning off the transistor Q28 to output the error signal EO at high level as an abnormality detecting signal during a write operation. Incidentally, since the transistor Q18 is forming a current corresponding to the write current in he write mode, the transistor Q26 is maintained in on-state during a normal operation, so that the transistor Q28 is turned on through the current mirror CM, similarly to the foregoing, to output the error signal EO at low level indicative of a normal operation.

An open-circuit (disconnection) state of the magnetic head 5 is detected by an open-circuit detector circuit OPC. A specific circuit configuration of the open-circuit detector circuit OPC will also be described below in detail with reference to FIG. 7. Briefly, if the magnetic head 5 falls into an open-circuit state, an output voltage from a write driver (WD) is detected to form a signal at low level. Similarly to the foregoing, the output signal $V_{OS}$ is thereby shifted to low level to turn off the transistor Q26, so that a base current of the transistor Q18 in write mode is not supplied from the current mirror CM to the transistor Q28, with the result that the transistor Q28 is turned off to output the error signal EO at high level as the abnormality detecting signal.

Differential transistors Q29, Q30 receive and amplify voltages at one and the other terminals of the magnetic head 5 to form respective amplified output voltages. The differential transistors Q29, Q30 are provided with load resistors R14, R15 connected to the respective collectors as well as with a constant current source connected to the common emitters. Collector voltages of the differential transistors Q29, Q30 are supplied to the bases of parallelly arranged transistors Q31, Q32, respectively. A transistor Q33 is arranged in a differential form with these transistors Q31, Q32, and is supplied with a reference voltage REF3 at the base.

During the read mode, since a voltage difference is hardly present between the terminals of the exclusively designed write magnetic head 5, the transistors Q29, Q30 are supplied at the respective bases with a substantially equal level. In response, transistors Q31, Q32 are also supplied with a substantially equal (common) level. In this event, the reference voltage REF3 supplied to the base of the transistor Q33 is set to a value higher than the common level of the transistors Q31, Q32 so as to maintain the transistor Q33 in on-state.

TABLE 1

| MODE | NORMAL/ABNORMAL | VOS | SETR | VIW | EO(Q28) |
|---|---|---|---|---|---|
| WRITE | NORMAL | H | L | ON | L(ON) |
| | ABNORMAL HEAD | L | L | ON | H(OFF) |
| | NO WRITE CURRENT | (L) | L | OFF | H(OFF) |
| READ | NORMAL | (H) | H | OFF | H(OFF) |
| | ABNORMAL WRITE CURRENT | (H) | H | OFF | L(ON) |
| | ABNORMAL HEAD TERMINAL CURRENT | (L) | H | OFF | L(ON) |

If a current flows into the magnetic head due to any abnormality in the read mode, a difference is present between voltages at both terminals of the magnetic head. This voltage difference is amplified by the differential transistors Q29, Q30 such that a potential at the base of the transistor Q31 or Q32 is made higher than the reference voltage REF3. This causes a current IUR to flow through the current mirror CM into the transistor Q28 which is thereby turned on to shift the error signal EO to low level. Since an abnormal operation of the magnetic head 5 as described above is possible only during the read mode, constant current sources connected to the common emitters of the differential transistors Q29, Q30; and Q31–Q33 are turned on by a read mode signal R only during the read mode. Since these circuits do not respond during the write mode, the abnormality detecting current IUR will not accidentally flow. The above Table 1 summarizes the respective signal states corresponding to normal and abnormal operations in each mode, wherein H designates high level, L low level, ON on-state, and OFF off-state.

In the block diagram of FIG. 3, plural kinds of abnormal states are detected by the respective circuits described above included in the abnormality detector circuit 9 and transmitted to an external higher-order circuit 15 as a single error signal in accordance with Table 1.

Figure 7:
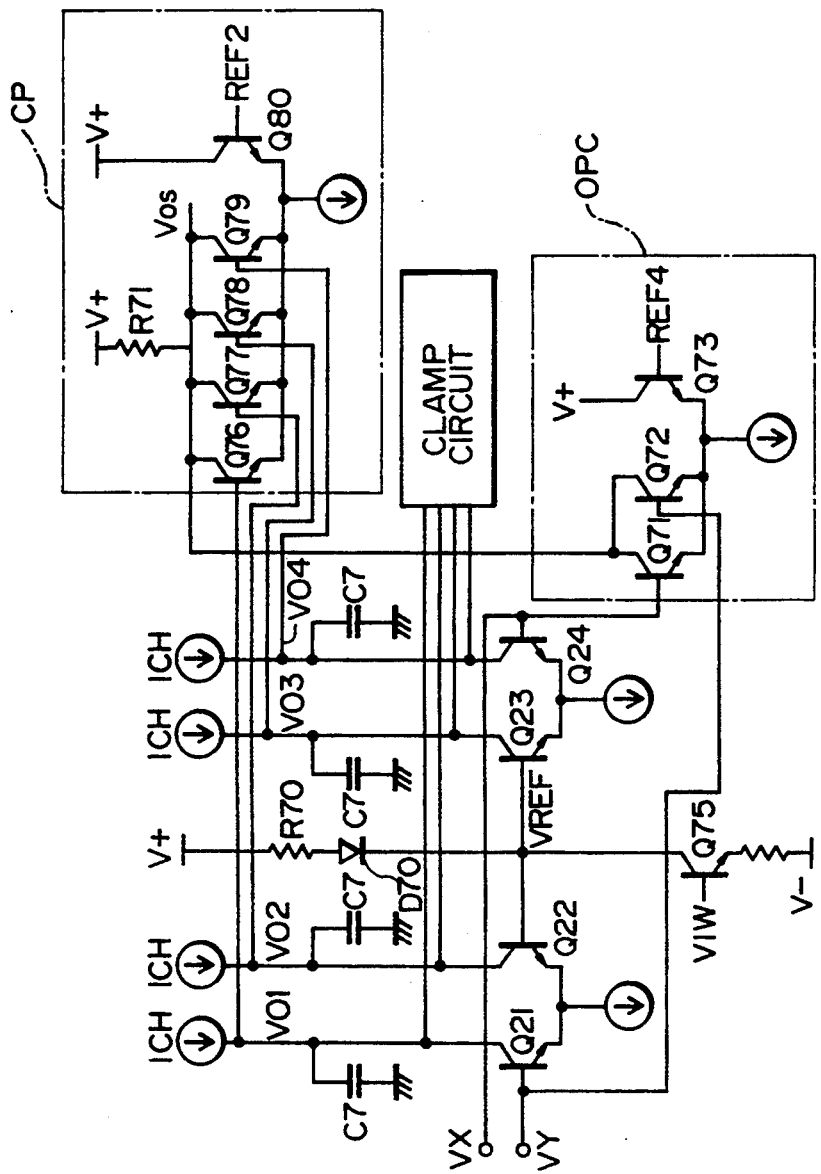
FIG. 7 is a circuit diagram showing examples of a timer circuit, a voltage comparator circuit and an open-circuit detector circuit in FIG. 2.

FIG. 7 shows specific circuit diagrams of the timer circuit, voltage comparator circuit CP and open-circuit detector circuit OPC.

Pairs of differential transistors Q21, Q22; and Q23, Q24 are each provided with a constant current source connected to the respective common emitters. The transistors Q22, Q23 are applied at the bases with a reference voltage VREF formed by passing through a resistor R70 and a diode D70 a current corresponding to a write current formed by a transistor Q75 which receives the write control signal VIW. By thus forming the reference voltage VREF corresponding to the write current, the reference voltage VREF is formed following voltages at the head terminals VX, VY in the write operation, so that a sufficient operation margin is ensured.

The differential transistors Q21–Q24 are arranged such that a sufficiently small current ICH, compared with a constant current generated on the emitter side, flows through the collectors thereof. Also, the transistors Q21–Q24 is provided with a clamp circuit connected to the respective collector such that the collector potential of each of the transistors Q21–Q24 is prevented from lowering below a predetermined level. For example, if a potential across a capacitor C7 connected to the transistor Q21 lowers below the predetermined level when the transistor Q21 is in on-state, a current is supplied from the clamp circuit so as to maintain the collector potential of the transistor Q21 at a constant level.

The voltage comparator circuit CP is composed of parallelly arranged transistors Q76–Q79 and a transistor Q80 arranged in a differential form with these transistors for performing comparison. The commonly connected collectors of the parallelly arranged transistors Q76–Q79 are provided with a load resistor R71 for forming the output voltage $V_{OS}$. The transistor Q80 is supplied at the base with a reference voltage REF2 for comparison and is provided with a constant current source which is connected to the common emitter. Alternatively, instead of generating the error detecting signal from the common collectors of the transistors Q76–Q79, the error detecting signal may be generated from the collector of the transistor Q80.

The open-circuit detector circuit OPC is composed of transistors Q71–Q73. The head terminals VY, VY are connected to the bases of the parallelly arranged transistors Q71, Q72, respectively. The transistor Q73 is arranged in a differential form with the transistors Q71, Q72. This transistor Q73 is supplied at the base with a reference voltage REF4 and is provided with a constant current source connected to the emitter. The common emitters of the parallelly arranged transistors Q71, Q72 are connected to a resistor R71 for forming the signal VOS. In this case, the error detecting signal may be generated from the collector of the transistor Q73 instead of from the common collectors of the transistors Q71, Q72.

FIG. 8 shows a waveform chart for explaining an example of the operation performed by the abnormality detector circuit. During a normal operation, voltages at the head terminals VX, VY alternately change in response to the switching of the write current. This allows the differential transistor pairs Q21, Q22; and Q23, Q24 to be alternately switched. As a result, the capacitor C7 is maintained at a level close to a clamp level by a relatively large constant current supplied from the emitter side. The transistors Q76–Q79 in the voltage comparator circuit CP are all in off-state, while the detecting signal VOS is at high level.

Referring back to FIG. 7, if a fault occurs in the head due to short-circuiting, the voltages at the head terminals VX, VY are shifted toward high level of the write amplifier, so that the transistors Q22, Q23 on the reference voltage side are merely instantaneously brought to on-state when the differential transistors are switched, whereas the transistors Q21, Q24 on the head terminal side remain in on-state for a majority of time. As a result, the capacitors C7, corresponding to the transistors Q22, Q23 in off-state, cannot be sufficiently discharged, whereby timer outputs VO2, VO3 change to high level by a small current ICH. These timer outputs VO2, VO3 at high level turn on transistors Q77, Q78, with the result that the detecting signal VOS is shifted to low level.

If either of the terminals VX and VY is short-circuited with a power supply, the potential at the short-circuited terminal is fixed at a supply voltage. This inhibits the above-mentioned differential transistors from being alternately switched, whereby at least one of the timer outputs VO1–VO4, corresponding to the fixed voltage, is shifted to high level. Then, similarly to the above, at least one of the transistors constituting the voltage comparator circuit is turned on to shift the detecting signal $V_{OS}$ to low level.

When the head is in open state, the head terminals VX, VY are alternately switched corresponding to an output voltage of the write amplifier. Therefore, the opened head cannot be detected by the timer circuit. However, since the voltage at the head terminal VX or VY becomes higher than the reference voltage REF4 corresponding to the output voltage of the write amplifier, the transistor Q71 or Q72 is turned on to cause a current to flow through the resistor R71 for forming the detecting signal VOS. Thus, the detecting signal VOS at low level is outputted.

Figure 9:
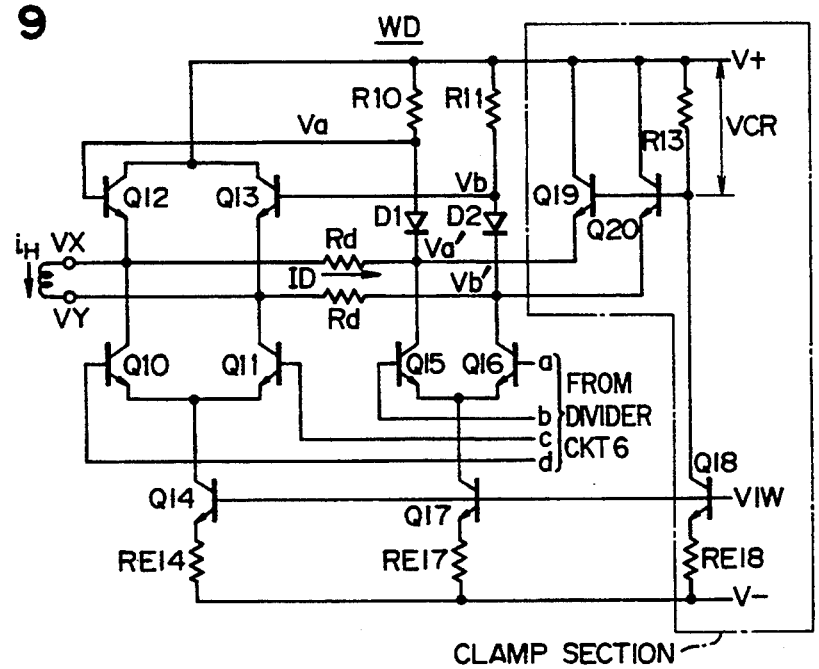
FIG. 9 is a circuit diagram showing another embodiment of the write circuit included in the read and/or write integrated circuit according to the present invention.

FIG. 9 is a circuit diagram showing another embodiment of a write circuit in a write-associated circuit provided in the read and/or write integrated circuit according to the present invention. In the drawing, parts having the same functions as elements in FIG. 2 are designated the same reference numerals.

This embodiment additionally includes a circuit for forming a current corresponding to a head current $i_H$ by a transistor Q18 and passing the current through a resistor R13 to generate a clamp voltage VCR which is outputted from emitter-follower transistors Q19, Q20 disposed in this circuit. The addition of this circuit results in stable clamp voltages Va', Vb' of differential transistors Q15, Q16.

FIG. 10 shows a waveform chart for explaining an exemplary operation of this embodiment. In a period ①, outputs a, c of a divider circuit 6 (divider outputs) are at high level to turn on transistors Q16, Q11. A transistor Q15 in off-state causes transistor Q12 to turn on, where a write current (head current) $i_H$ flows from the transistor Q12 through a terminal VX, magnetic coil, terminal VY, and transistor Q11.

When a period ② is entered, the divider outputs b, d go to high level, and a voltage Vx at the terminal VX lowers to a clamp voltage Va formed by a collector resistor R10 of the transistor Q15. In this event, the transistor Q12 remains at high level (emitter current=-head current). As a result, the voltage Vx at the head terminal VX follows the clamp voltage Va to reach a level lower by a base-emitter voltage $V_{BE}$ of the transistor Q12 than the clamp voltage Va.

The transistor Q13 in turn is in on-state because the divider output a at low level turns off the transistor Q16 to shift a collector voltage Vb of the transistor Q16 to high level. Thus, a voltage Vy at the terminal VY reaches a level lower than the voltage Vb by a base-emitter voltage VBE of the transistor Q13.

A voltage V between the head terminals Vx, Vy, i.e., V=Vy−Vx is expressed by the following equation (1):

$$Vy - Vx = (Vb - V_{BE}) - (Va - V_{BE}) \quad (1)$$
$$\approx Vb - Va \approx VCR$$

A switching time for the head current iH is expressed by Vy−Vx=L (di/dt). For a faster switching operation or faster (di/dt), Vy−Vx≈VCR may be made larger. Incidentally, a current ID flowing through a damping current Rd is zero during the period 2 since the voltages at both terminals of the damping resistor Rd, i.e., the voltages Vx and Va' are substantially at the same level. For this reason, the emitter current of the transistor Q12 becomes equal to the head current iH, so that the transistor Q12 remains in on-state.

If a damping resistor is disposed between both terminals of a head or between each head terminal and a supply voltage as before, a current corresponding to a relatively large voltage difference flows to cause the emitter current of the transistor Q12 to correspondingly decrease, with the result that a substantial head current is reduced. With an insufficiently small head current, the transistor Q12 will be turned off, and the voltage Vx will not decrease to Va-VBE. As a result, the difference Vy-Vx becomes smaller, thus decreasing or delaying di/dt. On the other hand, this embodiment permits the transistor Q12 to remain in on-state irrespective of the magnitude of the head current to provide the head voltage equal to the clamp voltage.

During a period td, the head current is switched, and current over-shoot is defined by the damping resistor. A voltage Va' presents a low impedance because the clamp circuit employs an emitter-follower configuration, so that the damping characteristic can be controlled by the resistor Rd. Generally, as the resistance value of the resistor Rd is smaller, a damping coefficient is larger so that current over-shoot is suppressed. In this embodiment, since the current switching speed is not affected as described above, the resistance value of the resistor Rd can be selected to be a sufficiently small value to provide a large damping coefficient. The faster current switching operation and a larger damping coefficient act in combination to enable a faster write operation.

Figure 16:
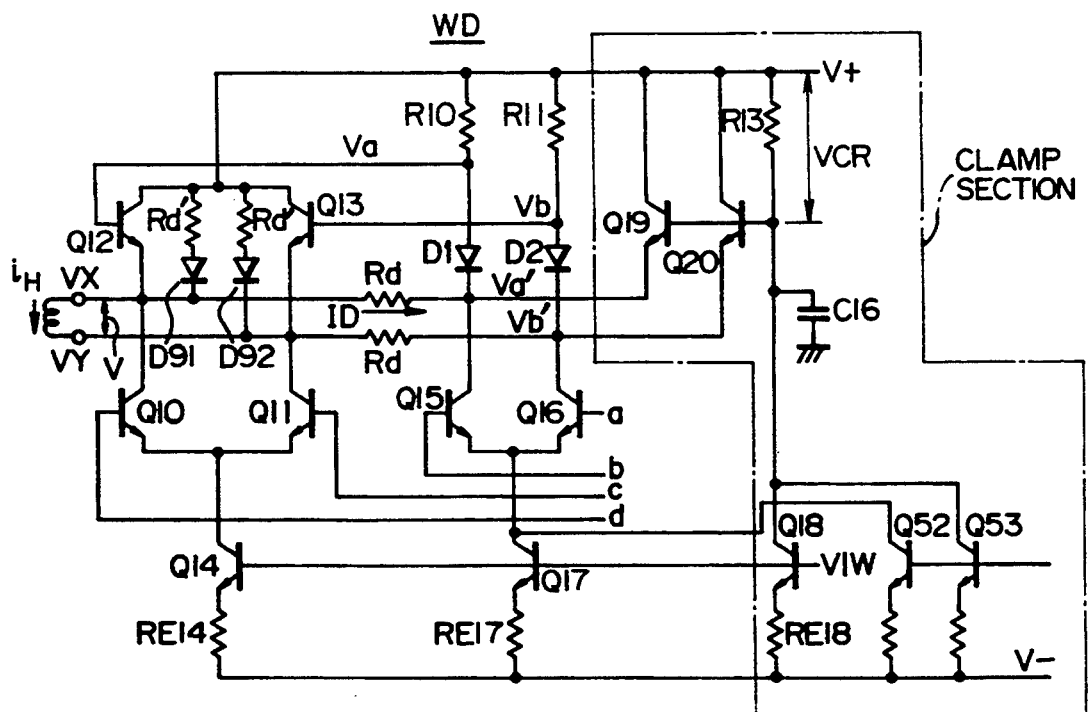
FIG. 16 is a circuit diagram showing another embodiment of a write circuit included in the read and/or write integrated circuit according to the present invention.

FIG. 16 shows a further embodiment of a write circuit provided in the read and/or write integrated circuit which is a modified example of the write circuit illustrated in FIG. 9. In this embodiment, a damping resistor Rd is inserted between each of head terminals VX, VY and a clamp circuit, and a damping resistor Rd' of a relatively large resistance value is inserted between each of the terminals VX, VY and a power supply V+, i.e., between the collector and the emitter of each of transistors Q12, Q13, like the circuit of FIG. 2, and diodes D91, D92 are additionally connected in series to the respective damping resistors Rd'. Incidentally, for improving the damping performance and reducing over-shoot, damping resistors Rd' of a relatively small resistance value may be inserted in general. However, if such damping resistors Rd' having a small resistance value are employed, a majority of collector currents of transistors Q10, Q11 flow through the damping resistors Rd' rather than the transistors Q12, Q13, whereby a write current (head current) iH will be reduced. On the other hand, a voltage V between head terminals should be larger for a faster current switching operation as described above. Therefore, the resistance value of the damping resistors Rd' is preferably larger in order to reduce currents flowing through the damping resistors Rd'. To solve this contradiction, the diodes D91, D92 are inserted in series to the damping resistors Rd' such that a voltage drop caused by each series circuit composed of the damping resistor and the diode is larger than a voltage drop which would be caused by the damping resistor alone. In this manner, the voltage V between head terminals can be made sufficiently large without employing damping resistors of a large resistance value. Additionally, by inserting he damping resistors Rd, the resistance value of the whole damping resistors can be reduced, thus further improving the damping performance. Thus, in this case, the damping resistors Rd' of a larger resistance value may also be employed than the case where the damping resistors Rd are not provided, which leads to providing a larger voltage V between the head terminals and a faster current switching operation. Furthermore, the reduction in the write current can also be prevented.

It should be noted that the embodiment shown in FIG. 2 may also be provided with diodes such as D91, D92.

Also in this embodiment, transistors Q52, Q53, which are applied with a fixed voltage at the bases, are provided to form a current not corresponding to the head current, as illustrated, such that this current is combined with a current corresponding to the head current, formed by transistors Q17, Q18, to produce a combined current which is passed through resistors R10, R11, R13. A clamp voltage VCR is generated by the combined current across a resistor R3 and outputted by emitter-follower transistors Q19, Q20. This configuration can effectively stabilize clamp voltages Va', Vb' of differential transistors Q15, Q16. More specifically, since the combined current includes a current portion not corresponding to the head current, the dependency of the clamp voltage VCR on the head current can be made lower, so that the clamp voltages Va', Vb' can be stabilized even with a small head current.

Further in this embodiment, capacitors C16 may be connected to the bases of the transistors Q19, Q20 so as to suppress noise which is possibly generated when data switching is performed.

FIG. 11 shows in a block diagram form another embodiment of the read and/or write integrated circuit according to the present invention. In this embodiment, a write magnetic head 5 is also provided with a sense amplifier 2', a level shifter circuit 3' and post-amplification output circuit 8' having similar functions as a sense amplifier 2, a level shifter circuit 3 and a post-amplification output circuit 8 disposed in a circuit associated with a read MR head.

In this embodiment, the write magnetic head 5 is an inductive head and may be utilized for reading reproduced signal. In this manner, reproduced signals can be obtained from a reproducing head (MR head) 1 as well as by utilizing the write head 5.

With the configuration as described above, a reproduced signal from the reproducing head 1 presents a high output while a reproduced signal from the write head 5 presents a low output. Conversely, if the same information written on a magnetic disk serving as a recording medium is read by both the heads 1, 5, a reading time difference will occur corresponding to the rotating speed of the magnetic disk and the distance between both the heads because the positions of the heads are slightly separated on the same track. However, an error rate associated with this time difference can be reduced by adjusting the time difference between a reproduced signal from the reproducing head 1 and a reproduced signal from the write head 5, comparing these reproduced signals and processing the reproduced signals based on the comparison result.

A timing adjusting circuit 4 in FIG. 11 forms voltages V1–V3 for adjusting switching timings of the post-amplification output circuits 8, 8' as mentioned above. For this purpose, output signals of the respective post-amplification output circuits 8, 8' are subjected to signal processing as described above to perform error reduction. In this event, the error reduction is achieved by weighting the output signal at low level of the post-amplification output circuit 8' with an appropriately small weighting coefficient.

Figure 12:
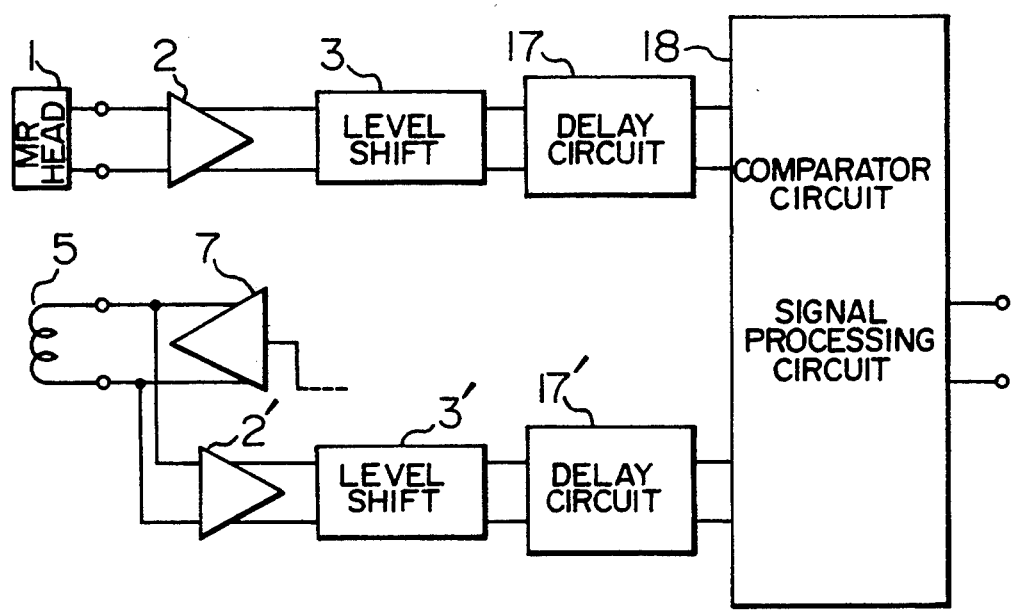
FIG. 12 is a block diagram showing a main portion of a further embodiment of the read and/or write integrated circuit according to the present invention.

FIG. 12 shows in a block diagram form another embodiment of the read and/or write integrated circuit according to the present invention. Also in this embodiment, a write magnetic head 5 is likewise provided with a sense amplifier 2', a level shifter circuit 3' and post-amplification output circuit 8' having similar functions as a sense amplifier 2, a level shifter circuit 3 and a post-amplification output circuit 8 disposed in a circuit associated with a read MR head, as is the case of the embodiment shown in FIG. 11. Additionally, delay circuits 17, 17' for adjusting a reading time difference as mentioned above are provided at the outputs of the level shifter circuits 3, 3' so as to coincide output timings of both the delay circuits 17, 17' which deliver their output signals to a comparator and signal processing circuit 18 to output a single signal including reduced errors.

Stated another way, in the embodiments shown in FIGS. 11, 12, read-out signals from the heads 1, 5 are processed by the timing adjusting circuit 4 or the delay circuits 17, 17' to be supplied to the post-amplification output circuits 8, 8' or the comparator/signal processing circuit 18 at the same timing for comparison. Then, a signal indicative of the comparison result is outputted as a signal for detecting errors in the read-out signal from the exclusively designed read head or as a signal for correcting errors detected in the read-out signal. It will be understood that the signal for error detection, signal processing on the signal for error correction, error detection, and error correction may be achieved using known PRLM (partial response maximum likelihood) techniques.

FIG. 13 shows a waveform chart representing signals existing in the respective sections of the embodiment illustrated in FIG. 12, for explaining an example of signal processing executed by the same.

A signal Ma represents a read-out signal from the exclusively designed read head 1, and a signal Ia represents a signal read out by using the write head 5. Between these signals Ma and Ia, a delay time $\tau H$ is present corresponding to the rotating speed of a magnetic disk and the distance between both the heads 1, 5. As can be seen in FIGS. 13(a), (b), the read-out signal Ia from the write head 5 is shown as being delayed from the read-out signal Ma from the exclusively designed read head 1.

The signals Ma, Ia are respectively waveformshaped to have the same amplitude, and then processed by the delay circuits to remove the time difference tH so that their peaks appear at the same time. By adding signals Mb and Ib thus formed to generate a sum signal Mb+Ib, noise present only in the signal Mb can be relatively reduced. The use of this technique improves margins of compared signals REF$\alpha$, $\beta$. Also, noise components only may be extracted by a difference Mb−Ib between the signals Mb and Ib. These noise components may be utilized for removing noise from the signal Mb.

As described above, the write only head is utilized to obtain a read-out signal simultaneously with read-out from the reproducing head 1, and error reduction can be achieved by the signal processing employing the signal reproduced by the write only head.

The effects produced by the above described embodiments may be summarized in the following manner:

(1) The timing adjusting circuit is provided, such that at a timing at which a differential amplifier circuit for amplifying a read-out signal stops an amplifying operation, the operation is stopped in the order of a second constant current element connected to an emitter-follower transistor for outputting the amplified signal, a power switching element for supplying an operating voltage to the differential amplifier circuit, and a first constant current element connected to the emitter of the differential amplifier transistor, while these elements are turned on in the reverse order at a timing at which the differential amplifier circuit starts the amplification operation, thereby preventing changes in potentials across DC blocking capacitors coupled to the differential amplifier circuit and enabling a faster read operation.

(2) A damping resistor is disposed between each of both magnetic head terminals and a clamp circuit in a magnetic head driving circuit in such a manner that resistors of a smaller resistance value may be employed, whereby an over-shoot amount is reduced, and a write current does not flow through the damping resistors, thus achieving a faster write operation.

(3) A used reference voltage is formed on the basis of a current corresponding to a write current. Voltages at one and the other terminals of the magnetic head are supplied to two differential transistor circuits, respectively. Relatively small current is supplied to each of differential transistors constituting the differential transistor circuits from the collector. A constant current source is connected to the common emitter of each differential transistor circuit for generating a sufficiently large current as compared with the current supplied from the collector. A voltage clamp circuit is connected to the respective collectors of the differential transistors. Respective collector voltages of the two pairs of differential transistors are supplied to the bases of the four parallelly arranged transistors. By a transistor arranged in a differential form with these transistors and receiving a reference voltage set at a higher voltage by a clamp voltage generated by the clamp circuit, a detecting signal for indicating short-circuiting of the head or a fixed voltage present at the head can be derived from the common collectors of the four transistors or from the collector of a transistor arranged in a differential form with the four transistors.

(4) A pair of transistors supplied at the bases with voltages at one and the other terminals of a head and having the collectors and emitters commonly connected, and a transistor arranged in a differential form with the pair of transistors and supplied at the base with a predetermined reference voltage higher than normal voltages at the magnetic head terminals are provided to generate an abnormality detecting signal indicative of an opened head from the commonly connected collectors of the pair of transistors or from the collector of the transistor arranged in the differential form the pair of transistors.

(5) In a configuration including an exclusively designed read head using a magnetoresistance effect element and a write magnetic head, the write magnetic head is provided with a read circuit in order to output read-out signals in a read mode, which are utilized for detecting errors in read-out signals from the exclusively designed read head or for detecting and correcting such errors, thus achieving error reduction.

While the invention created by the present inventors has been specifically described in connection with embodiments thereof, it goes without saying that the present invention is not limited to the foregoing embodiments but can be modified in various manners without departing from the gist thereof. For example, write data is not necessarily inputted in differential manner, or the divider circuit may be omitted. The number of heads connected to the read and/or write integrated circuit may be arbitrarily selected as required.

It will be appreciated that the present invention can be widely utilized as a read and/or write integrated circuit Effects produced by representative inventions disclosed in this application may be summarized in the following manner. According to an example of the timing adjusting circuit of the invention, at a timing at which a differential amplifier circuit for amplifying a read-out signal stops an amplifying operation, the operation is stopped in the order of a second constant current element connected to an emitter-follower transistor for outputting the amplified signal, a power switching element for supplying an operating voltage to the differential amplifier circuit, and a first constant current element provided to the common emitter of the differential amplifier circuit, while these elements are turned on in the order reverse to the above at a timing at which the differential amplifier circuit starts the operation, thereby preventing changes in potential of a DC blocking capacitor coupled to the emitter-follower transistor and enabling a faster read operation.

A damping resistor is disposed between each of both magnetic head terminals and a clamp circuit in a magnetic head driving circuit in such a manner that resistors of a smaller resistance value may be employed, whereby an overshoot amount is reduced, and a write current does not flow through the damping resistors, thus achieving a faster write operation.

A used reference voltage is formed on the basis of a current corresponding to a write current. Voltages at one and the other terminals of the magnetic head are supplied to two differential transistor circuits, respectively. Relatively small current is supplied to each of differential transistors constituting the differential transistor circuits from the collector. A constant current source is connected to the common emitter of each differential transistor circuit for generating a sufficiently large current as compared with the current supplied from the collector. A voltage clamp circuit is connected to the respective collectors of the differential transistors. Respective collector voltages of the two pairs of differential transistors are supplied to the bases of the four parallelly arranged transistors. By a transistor arranged in a differential form with these transistors and receiving a reference voltage set at a higher voltage by a clamp voltage generated by the clamp circuit, a detecting signal for indicating short-circuiting of the head or a fixed voltage present at the head can be derived from the common collectors of the four transistors or from the collector of a transistor arranged in a differential form with the four transistors.

A pair of transistors supplied at the bases with voltages at one and the other terminals of a head and having the collectors and emitters commonly connected, and a transistor arranged in a differential form with the pair of transistors and supplied at the base with a predetermined reference voltage higher than normal voltages at the magnetic head terminals are provided to generate an abnormality detecting signal indicative of an opened head from the commonly connected collectors of the pair of transistors or from the collector of the transistor arranged in the differential form with the pair of transistors.

In a configuration including an exclusively designed read head using a magnetoresistance effect element and a write magnetic head, the write magnetic head is provided with a read circuit in order to output read-out signals in a read mode, which are utilized for detecting errors in read-out signals from the exclusively designed read head or for detecting and correcting such errors, thus achieving error reduction.

Now, the present invention is also applicable to the read and/or write integrated circuit which utilizes an inductive head as a read head.

What is claimed is:

1. A read integrated circuit comprising:
  a differential amplifier circuit for amplifying a read-out signal;
  an operation timing adjusting circuit responsive to operation mode signals indicative of an operation mode of said read integrated circuit for outputting first, second and third control signals;
  a switching element responsive to said first control signal for supplying said differential amplifier circuit with a power supply voltage for setting said differential amplifier circuit in an operative state;
  a first constant current element, connected to a common emitter of said differential amplifier circuit and responsive to said second control signal to turn into operable state, said first element further turning into operative state, when said differential amplifier circuit is set into operative state in the operable state of said first constant current element, to cause a constant operating current to flow through said differential amplifier circuit;
  an emitter-follower output transistor responsive to an output signal of said differential amplifier circuit to turn into operative state to output said read-out signal amplified by said differential amplifier circuit; and
  second constant current elements, connected to the emitter of said emitter-follower output transistor and responsive to said third control signal to turn into operable state, said second constant current elements further turning into operative state, when said emitter-follower output transistor is set into operative state in the operable state of said second constant current elements, to cause a constant operating current to flow into said emitter-follower output transistor, wherein said operation timing adjusting circuit outputs said first, second and third control signals so as to set said first constant current element, said switching element and said second constant current element into operative state in this order when said operation mode signals instruct said differential amplifier circuit to start an amplification operation, and so as to set said second constant current elements, said switching element and said first constant current element into inoperative state in this order when said operation mode signals instruct said differential amplifier circuit to stop the amplification operation.

2. A read integrated circuit according to claim 1, wherein: the read-out signal amplified by said differential amplifier circuit is a read-out signal from an exclusively designed read head formed of a magnetoresistance effect element.

3. A read integrated circuit comprising:
a differential amplifier circuit for amplifying a read-out signal;
an operation timing adjusting circuit responsive to operation mode signals indicative of an operation mode of said read integrated circuit for outputting first and second control signals;
a switching element responsive to said first control signal for supplying said differential amplifier circuit with a power supply voltage for setting said differential amplifier circuit into operative state;
a constant current element, connected to a common emitter of said differential amplifier circuit and responsive to said second control signal to turn into operable state, said constant current element further turning into operative state when said differential amplifier circuit is set into operative state in the operable state of said constant current element to cause a constant operating current to flow through said differential amplifier circuit; and
an emitter-follower output transistor responsive to an output signal of said differential amplifier circuit to turn into operative state for outputting said read-out signal amplified by said differential amplifier circuit, wherein said operation timing adjusting circuit outputs said first and second control signals so as to set said constant current element and said switching element into operative state in this order when said operation mode signals instruct said differential amplifier circuit to start an amplification operation, and so as to set said switching element and said constant current element into inoperative state in this order when said operation mode signals instruct said differential amplifier circuit to stop the amplification operation.

4. A read integrated circuit according to claim 3, wherein:
the read-out signal amplified by said differential amplifier circuit is a read-out signal from an exclusively designed read head formed of a magnetoristance effect element.

* * * * *

UNITED STATES PATENT AND TRADEMARK OFFICE
CERTIFICATE OF CORRECTION

PATENT NO. : 5,434,717
DATED : July 18, 1995
INVENTOR(S) : M. YOSHINAGA et al

It is certified that error appears in the above-indentified patent and that said Letters Patent is hereby corrected as shown below:

On the title page item [73],
Add assignee --HITACHI COMMUNICATION SYSTEM, INC.
       YOKOHAMA, JAPAN--.

Signed and Sealed this

Nineteenth Day of August, 1997

*Attest:*

BRUCE LEHMAN

*Attesting Officer*  Commissioner of Patents and Trademarks

UNITED STATES PATENT AND TRADEMARK OFFICE
CERTIFICATE OF CORRECTION

PATENT NO. : 5,434,717
DATED : July 18, 1995
INVENTOR(S) : M. YOSHINAGA et al

It is certified that error appears in the above-indentified patent and that said Letters Patent is hereby corrected as shown below:

On the title page, item [73]:

Add assignee --HITACHI COMMUNICATION SYSTEMS, INC.
Yokohama, JAPAN--.

This certificate supersedes Certificate of Correction issued August 19, 1997.

Signed and Sealed this

Tenth Day of August, 1999

Attest:

Q. TODD DICKINSON

Attesting Officer

Acting Commissioner of Patents and Trademarks